US012677498B2

(12) United States Patent
Imoto et al.

(10) Patent No.: US 12,677,498 B2
(45) Date of Patent: Jul. 7, 2026

(54) SENSOR DEVICE AND DISTANCE MEASUREMENT DEVICE

(71) Applicant: SONY SEMICONDUCTOR SOLUTIONS CORPORATION, Kanagawa (JP)

(72) Inventors: Tsutomu Imoto, Kanagawa (JP); Masahiro Hosoya, Kanagawa (JP); Yusuke Otake, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 1002 days.

(21) Appl. No.: 17/759,953

(22) PCT Filed: Jan. 6, 2021

(86) PCT No.: PCT/JP2021/000224
§ 371 (c)(1),
(2) Date: Aug. 2, 2022

(87) PCT Pub. No.: WO2021/161687
PCT Pub. Date: Aug. 19, 2021

(65) Prior Publication Data
US 2023/0061837 A1      Mar. 2, 2023

(30) Foreign Application Priority Data

Feb. 10, 2020      (JP) .................................. 2020-020363

(51) Int. Cl.
*G01S 7/48* (2006.01)
*G01S 7/4865* (2020.01)
(Continued)

(52) U.S. Cl.
CPC .......... *H10F 39/809* (2025.01); *G01S 7/4865* (2013.01); *G01S 17/10* (2013.01); *H10W 90/792* (2026.01)

(58) Field of Classification Search
USPC ......................................................... 356/5.01
See application file for complete search history.

(56) References Cited

U.S. PATENT DOCUMENTS 9,224,778 B2 * 12/2015 Wakano ................ H10F 39/813
9,397,133 B2 * 7/2016 Wakano ............... H04N 25/778
(Continued)

FOREIGN PATENT DOCUMENTS

CN        102208422 A      10/2011
CN        102209206 A      10/2011
(Continued)

OTHER PUBLICATIONS

English machine Translation of JP2009-014460A (Year: 2009).*
(Continued)

*Primary Examiner* — James R Hulka
(74) *Attorney, Agent, or Firm* — CHIP LAW GROUP

(57)      ABSTRACT

Provided is a sensor device that includes a first chip including a first semiconductor substrate and a first wire formation layer and including a pixel that includes a photoelectric conversion element, and a first transfer gate element and a second transfer gate element configured to transfer accumulated charges of the photoelectric conversion element, and a second chip including a second semiconductor substrate and a second wire formation layer, in which a first wire electrically connected to the first transfer gate element, a second wire electrically connected to the second transfer gate element, and a third wire electrically connected to a ground are formed. Each of the first wire, the second wire, and the third wire is formed by bonding a first portion of the first wire (Continued)

formation layer and extending in a first direction and a second portion of the second wire formation layer and extending in the first direction.

11 Claims, 13 Drawing Sheets

(51) Int. Cl.

| | | |
|---|---|---|
| *G01S 17/10* | (2020.01) | |
| *H10F 39/00* | (2025.01) | |
| *H10W 90/00* | (2026.01) | |

(56) References Cited

U.S. PATENT DOCUMENTS

| | | | | |
|---|---|---|---|---|
| 9,978,799 | B2 * | 5/2018 | Wakano | H10F 39/813 |
| 10,438,987 | B2 * | 10/2019 | Mandai | H04N 25/771 |
| 10,473,782 | B2 * | 11/2019 | Ikeda | G05D 1/0238 |
| 10,483,313 | B2 * | 11/2019 | Wakano | H10F 39/199 |
| 10,658,419 | B2 * | 5/2020 | Mandai | H04N 25/771 |
| 10,672,818 | B2 * | 6/2020 | Tanaka | H10F 30/225 |
| 10,680,028 | B2 * | 6/2020 | Kobayashi | H10F 39/811 |
| 11,142,376 | B2 * | 10/2021 | Choltco-Devlin | B65D 43/16 |
| 11,221,256 | B2 * | 1/2022 | Toda | G01J 3/2803 |
| 11,222,916 | B2 * | 1/2022 | Kobayashi | H10F 39/802 |
| 11,411,032 | B2 * | 8/2022 | Tanaka | H10F 39/8057 |
| 11,817,471 | B2 * | 11/2023 | Yamagishi | H10F 39/811 |
| 2013/0214371 | A1 | 8/2013 | Asatsuma | |
| 2014/0239433 | A1 * | 8/2014 | Wakano | H10F 39/813 |
| | | | | 257/443 |
| 2016/0079296 | A1 * | 3/2016 | Wakano | H10F 39/809 |
| | | | | 257/447 |
| 2016/0276391 | A1 | 9/2016 | Wakano | |
| 2017/0038471 | A1 * | 2/2017 | Ikeda | H10F 55/255 |
| 2017/0328776 | A1 * | 11/2017 | Shimasaki | H04N 25/76 |
| 2018/0019343 | A1 * | 1/2018 | Asami | H01L 21/02266 |
| 2018/0090526 | A1 * | 3/2018 | Mandai | H10F 39/803 |
| 2018/0090536 | A1 * | 3/2018 | Mandai | H10F 39/807 |
| 2018/0261643 | A1 * | 9/2018 | Wakano | H10F 39/813 |
| 2019/0181177 | A1 * | 6/2019 | Kobayashi | H10F 39/811 |
| 2019/0252442 | A1 * | 8/2019 | Tanaka | H10F 77/413 |
| 2019/0253657 | A1 | 8/2019 | Kobayashi | |
| 2019/0342510 | A1 * | 11/2019 | Sano | H10F 39/811 |
| 2020/0102127 | A1 * | 4/2020 | Choltco-Devlin | B65D 43/16 |
| 2020/0203415 | A1 * | 6/2020 | Kobayashi | H10F 39/199 |
| 2020/0258930 | A1 * | 8/2020 | Tanaka | H10F 39/807 |
| 2020/0386620 | A1 * | 12/2020 | Toda | G01J 3/2803 |
| 2021/0135021 | A1 * | 5/2021 | Neya | H10F 39/807 |
| 2021/0167114 | A1 * | 6/2021 | Ogita | H10F 39/8063 |
| 2021/0391371 | A1 * | 12/2021 | Yamagishi | H10F 39/811 |

FOREIGN PATENT DOCUMENTS

| | | | |
|---|---|---|---|
| CN | 106449668 A | 2/2017 | |
| CN | 109937482 A | 6/2019 | |
| CN | 110235255 A | 9/2019 | |
| CN | 110678984 A | 1/2020 | |
| EP | 2765608 A1 | 8/2014 | |
| JP | 2009-008537 A | 1/2009 | |
| JP | 2009-014460 A | 1/2009 | |
| JP | 2015128187 A | 7/2015 | |
| JP | 2018-088488 A | 6/2018 | |
| JP | 2018-137284 A | 8/2018 | |
| JP | 2019-004149 A | 1/2019 | |
| JP | 2019-033136 A | 2/2019 | |
| JP | 2019-530215 A | 10/2019 | |
| WO | 2018/174090 A1 | 9/2018 | |

OTHER PUBLICATIONS

English Translation of the Written Opinion of the International Search Authority for PCT/JP2021/000224 (Year: 2021).*

International Search Report and Written Opinion of PCT Application No. PCT/JP2021/000224, issued on Mar. 23, 2021, 11 pages of ISRWO.

Bin Luo et al., "Research of Noise Suppression for CMOS Image Sensor", f2010 International Conference on Measuring Technology and Mechatronics Automation, 2010, 1100-1103.

Wang Panpan, "Design, Construction of Photoelectrochemical Biosensors Based on Metallic Oxide Nanomatericals", China Excellence Masters, May 2014.

* cited by examiner 10 (DISTANCE MEASUREMENT DEVICE)

Cp2
(SECOND CHIP)

Cp1
(FIRST CHIP)

Bs2
(SECOND SEMICONDUCTOR
SUBSTRATE)

Ar2
(SECOND WIRE
FORMATION LAYER)

Ar1
(FIRST WIRE
FORMATION LAYER)

Bs1
(FIRST SEMICONDUCTOR
SUBSTRATE)

1

SENSOR DEVICE AND DISTANCE MEASUREMENT DEVICE

CROSS REFERENCE TO RELATED APPLICATIONS

This application is a U.S. National Phase of International Patent Application No. PCT/JP2021/000224 filed on Jan. 6, 2021, which claims priority benefit of Japanese Patent Application No. JP 2020-020363 filed in the Japan Patent Office on Feb. 10, 2020. Each of the above-referenced applications is hereby incorporated herein by reference in its entirety.

TECHNICAL FIELD

The present technology relates to a sensor device including a pixel that includes a photoelectric conversion element, and a first transfer gate element and a second transfer gate element configured to transfer accumulated charges of the photoelectric conversion element, and a distance measurement device including the sensor device and measuring a distance to an object, and particularly relates to a wiring technology in the sensor device.

BACKGROUND ART

Various distance measurement techniques for measuring a distance to an object are known, and in recent years, for example, a distance measurement technique based on a time of flight (ToF) method has attracted attention. The ToF method is roughly divided into a direct ToF method and an indirect ToF method. The direct ToF method is a method of calculating the distance on the basis of a result of measuring a round-trip time of light emitted to an object by a time measurement device such as a time-to-digital converter (TDC). On the other hand, the indirect ToF method is a method of calculating the distance on the basis of a light reception amount of reflected light from the object without measuring the round-trip time of light as described above.

In the sensor device used in the indirect ToF method, the reflected light from the object is photoelectrically converted by a photoelectric conversion element such as a photodiode. Signal charges obtained by the photoelectric conversion are distributed to two floating diffusions (floating diffusion regions) by a pair of transfer gate elements alternately turned on.

In the indirect ToF method, the charge distribution as described above is repeatedly performed a predetermined number of times such as several thousand times in a predetermined light receiving period, and consequently, the distance is calculated on the basis of the difference between respective signal charges accumulated in the two floating diffusions.

Note that Patent Document 1 below can be cited as a related conventional technique.

CITATION LIST

Patent Document

Patent Document 1: Japanese Patent Application Laid-Open No. 2009-8537

SUMMARY OF THE INVENTION

Problems to be Solved by the Invention

Here, as in the sensor device used in the indirect ToF method as described above, in the sensor device that distributes charges to two floating diffusions by the two transfer gate elements provided for the photoelectric conversion element, for example, in a case where the two transfer gate elements do not accurately operate, the charge distribution to each floating diffusion is not appropriately performed, leading to deterioration of the distance measurement performance.

The present technology has been made in view of the above circumstances, and an object of the present technology is to improve accuracy of operation and improve distance measurement performance of a sensor device used for distance measurement by an indirect ToF method or the like, for example.

Solutions to Problems

A sensor device according to the present technology includes a first chip including a first semiconductor substrate and a first wire formation layer and including a pixel that includes a photoelectric conversion element, and a first transfer gate element and a second transfer gate element configured to transfer accumulated charges of the photoelectric conversion element, and a second chip including a second semiconductor substrate and a second wire formation layer, in which a first wire electrically connected to the first transfer gate element, a second wire electrically connected to the second transfer gate element, and a third wire electrically connected to a ground are formed, and each of the first wire, the second wire, and the third wire is formed by bonding a first portion formed in the first wire formation layer and extending in a first direction and a second portion formed in the second wire formation layer and extending in the first direction.

According to the above configuration, the first wire for the first transfer gate element, the second wire for the second transfer gate element, and the third wire as a ground wire are formed together as inter-chip bonding wires for bonding the first chip and the second chip. That is, by forming the first wire, the second wire, and the third wire by the same type of wire as the inter-chip bonding wire, the wire resistances can be made equal.

In the sensor device according to the present technology described above, it is conceivable to employ a configuration in which the sensor device is a distance measurement sensor by an indirect time-of-flight (ToF) method.

In the indirect ToF method, a method of distributing accumulated charges of the photoelectric conversion element to two floating diffusions by the first and second transfer gate elements is employed.

In the sensor device according to the present technology described above, it is conceivable to employ a configuration in which the first wire, the second wire, and the third wire are each formed by connecting the first portion and the second portion to each other by copper-copper (Cu—Cu) connection.

The Cu—Cu connection is preferable as a connection technique between chips from the viewpoint of track record and reliability.

In the sensor device according to the present technology described above, it is conceivable to employ a configuration in which the first wire and the second wire are arranged symmetrically with the photoelectric conversion element interposed therebetween.

Thus, for the first intermediate wire that is the wire connecting the first transfer gate element and the first wire and the second intermediate wire that is the wire connecting the second transfer gate element and the second wire, wire lengths can be made equal and wire resistances can be made equal.

In the sensor device according to the present technology described above, it is conceivable to employ a configuration in which wire widths of the first wire, the second wire, and the third wire are substantially same.

This makes it possible to equalize respective wire resistances of the first wire, the second wire, and the third wire.

In the sensor device according to the present technology described above, it is conceivable to employ a configuration in which cross-sectional areas of the first wire, the second wire, and the third wire are substantially same.

This makes it possible to equalize respective wire resistances of the first wire, the second wire, and the third wire.

In the sensor device according to the present technology described above, it is conceivable to employ a configuration in which in a direction orthogonal to a stacking direction of the first chip and the second chip, at least a part of the first wire overlaps the first transfer gate element and at least a part of the second wire overlaps the second transfer gate element.

Thus, for each of the first intermediate wire that is the wire connecting the first wire and the first transfer gate element and the second intermediate wire that is the wire connecting the second wire and the second transfer gate element, it is not necessary to route the wires in the direction orthogonal to the above-described stacking direction, and the wire resistances of the both wires can be reduced. Furthermore, a line-to-line capacitance with the adjacent wire can also be reduced.

In the sensor device according to the present technology described above, it is conceivable to employ a configuration in which the first wire and the first transfer gate element, and the second wire and the second transfer gate element are connected by a connection portion including one or a plurality of vias and extending substantially linearly in the stacking direction.

Thus, the respective wire lengths of the first intermediate wire that is a wire connecting the first wire and the first transfer gate element and the second intermediate wire that is a wire connecting the second wire and the second transfer gate element can be set to a length corresponding to a separation distance in the stacking direction between the first wire and the first transfer gate element and a length corresponding to a separation distance in the stacking direction between the second wire and the second transfer gate element, and the wire resistances of the first and second intermediate wires and the line-to-line capacitance with the adjacent wire can be minimized.

In the sensor device according to the present technology described above, it is conceivable to employ a configuration in which an interval between the first wire and the third wire adjacent to the first wire and an interval between the second wire and the third wire adjacent to the second wire are substantially equal.

Thus, the line-to-line capacitance (parasitic capacitance acting on the first wire) between the first wire and the third wire and the line-to-line capacitance (parasitic capacitance acting on the second wire) between the second wire and the third wire become substantially equal, the blunting of the drive waveforms of the first and second transfer gate elements does not become unbalanced, and it is possible to accurately perform charge distribution to the two floating diffusions.

In the sensor device according to the present technology described above, it is conceivable to employ a configuration in which in the first wire formation layer, a wire layer in which the first portions of the first wire, the second wire, and the third wire are formed, and an intermediate wire layer other than the wire layer are formed, and at least a part of the third wire overlaps the pixel in a direction orthogonal to a stacking direction of the first chip and the second chip, and the third wire is connected in the pixel to an intermediate ground wire that is a wire formed in the intermediate wire layer and connected to a ground in the pixel.

This makes it possible to increase the cross-sectional area of the third wire (ground wire).

Furthermore, a distance measurement device according to the present technology includes a light emitting unit that emits irradiation light to an object, and a sensor unit that receives reflected light of the irradiation light from the object, in which the sensor unit includes a first chip including a first semiconductor substrate and a first wire formation layer and including a pixel that includes a photoelectric conversion element, and a first transfer gate element and a second transfer gate element configured to transfer accumulated charges of the photoelectric conversion element, and a second chip including a second semiconductor substrate and a second wire formation layer, a first wire electrically connected to the first transfer gate element, a second wire electrically connected to the second transfer gate element, and a third wire electrically connected to a ground are formed, and each of the first wire, the second wire, and the third wire is formed by bonding a first portion formed in the first wire formation layer and extending in a first direction and a second portion formed in the second wire formation layer and extending in the first direction.

With such a distance measurement device, it is also possible to obtain a similar operation to that of the sensor device according to the present technology described above.

MODE FOR CARRYING OUT THE INVENTION

Hereinafter, an embodiment according to the present technology will be described in the following order with reference to the accompanying drawings.

<1. Configuration of distance measurement device>
<2. Circuit configuration of sensor unit>
<3. Circuit configuration of pixel array unit>
<4. Structure of sensor unit>
<5. Inter-chip bonding as embodiment>
<6. Modification example relating to disposition of inter-chip bonding wire>
<7. Other modification examples>
<8. Summary of embodiment>
<9. Present technology>

1. Configuration of Distance Measurement Device

Figure 1:
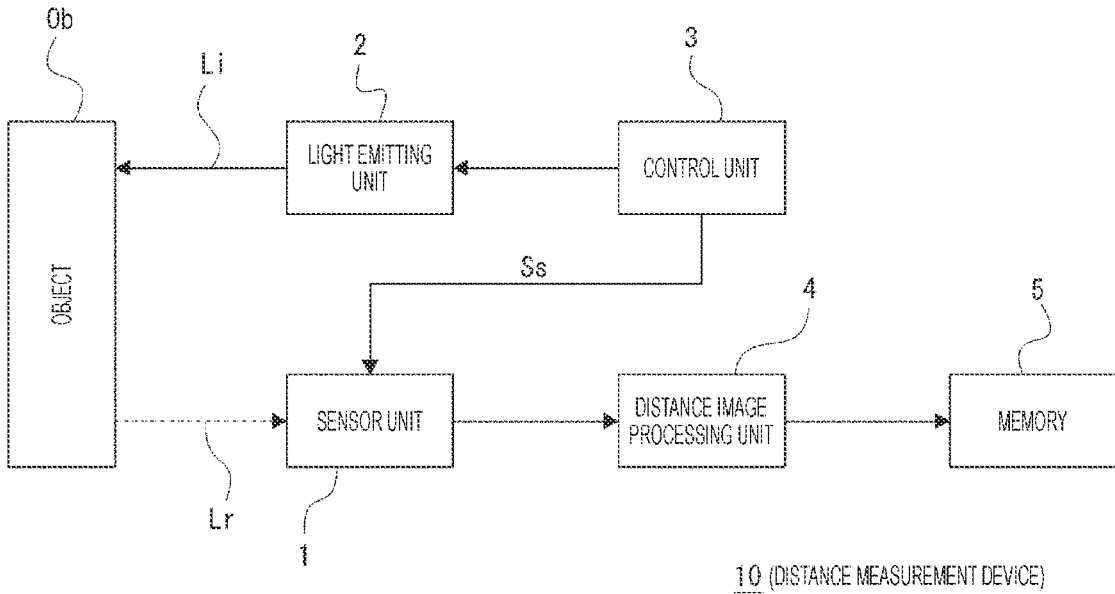
FIG. 1 is a block diagram for explaining a configuration example of a distance measurement device as an embodiment according to the present technology.

FIG. 1 is a block diagram for describing a configuration example of a distance measurement device 10 as an embodiment according to the present technology.

The distance measurement device 10 includes a sensor unit 1, a light emitting unit 2, a control unit 3, a distance image processing unit 4, and a memory 5. The distance measurement device 10 is a device that performs distance measurement by a time of flight (ToF) method. Specifically, the distance measurement device 10 of this example performs distance measurement by an indirect ToF method. The indirect ToF method is a distance measuring method of calculating a distance to an object Ob on the basis of a phase difference between irradiation light Li with respect to the object Ob and reflected light Lr obtained by reflecting the irradiation light Li by the object Ob.

The light emitting unit 2 includes one or a plurality of light emitting elements as a light source, and emits irradiation light Li to the object Ob. In this example, the light emitting unit 2 emits, for example, infrared light having a wavelength in a range of 780 nm to 1000 nm as the irradiation light Li.

The control unit 3 controls light emission operation of the irradiation light Li by the light emitting unit 2. In a case of the indirect ToF method, light whose intensity is modulated so that the intensity changes at a predetermined cycle is used as the irradiation light Li. Specifically, in this example, pulsed light is repeatedly emitted at a predetermined cycle as the irradiation light Li. Hereinafter, such a light emission cycle of the pulsed light is referred to as a "light emission cycle Cl". Furthermore, a period between light emission start timings of the pulsed light when the pulsed light is repeatedly emitted at light emission cycles Cl is referred to as "one modulation period Pm" or simply a "modulation period Pm".

The control unit 3 controls the light emission operation of the light emitting unit 2 so as to emit the irradiation light Li only during a predetermined light emitting period in every modulation period Pm.

Here, in the indirect ToF method, the light emission cycle Cl is relatively fast at about, for example, several tens of MHz to several hundreds of MHz.

The sensor unit 1 receives the reflected light Lr and outputs distance measurement information by the indirect ToF method on the basis of a phase difference between the reflected light Lr and the irradiation light Li.

As will be described later, the sensor unit 1 of this example includes a pixel array unit 11 in which a plurality of pixels Px including a photoelectric conversion element (photodiode PD), a first transfer gate element (transfer transistor TG-A) for transferring accumulated charges of the photoelectric conversion element, and a second transfer gate element (transfer transistor TG-B) is two-dimensionally arranged, and obtains the distance measurement information by the indirect ToF method for every pixel Px.

Note that, hereinafter, information indicating the distance measurement information (distance information) for every pixel Px as described above is referred to as a "distance image".

Here, as is known, in the indirect ToF method, signal charges accumulated in the photoelectric conversion element in the pixel Px are distributed to two floating diffusions (FD) by the first transfer gate element and the second transfer gate element which are alternately turned on. At this time, a cycle in which the first transfer gate element and the second transfer gate element are alternately turned on is the same cycle as the light emission cycle Cl of the light emitting unit 2. That is, each of the first transfer gate element and the second transfer gate element is turned on once in every modulation period Pm, and the distribution of the signal charges into the two floating diffusions as described above is repeatedly performed in every modulation period Pm.

In this example, the transfer transistor TG-A as the first transfer gate element is turned on in the light emitting period of the irradiation light Li in the modulation period Pm, and the transfer transistor TG-B as the second transfer gate element is turned on in the non-light emitting period of the irradiation light Li in the modulation period Pm.

As described above, since the light emission cycle Cl is relatively fast, the signal charges accumulated in each floating diffusion by one distribution using the first and second transfer gate elements as described above is relatively small. For this reason, in the indirect ToF method, the emission of the irradiation light Li is repeated about several thousand times to several tens of thousands of times per distance measurement (that is, in obtaining a distance image of one image), and the sensor unit 1 repeatedly distributes the signal charges to each floating diffusion using the first and second transfer gate elements as described above while the irradiation light Li is repeatedly emitted in this manner.

As understood from the above description, in the sensor unit 1, the first transfer gate element and the second transfer gate element are driven at a timing synchronized with the light emission cycle of the irradiation light Li in every pixel Px. Thus, to the sensor unit 1, a synchronization signal Ss indicating the timing synchronized with the light emission cycle Cl is input from the control unit 3, and is used to drive the first and second transfer gate elements in each pixel Px.

In the distance image processing unit 4, the distance image obtained by the sensor unit 1 is input, for example, and is subjected to predetermined signal processing such as compression encoding and then output to the memory 5.

For example, the memory 5 is a storage device such as a flash memory, a solid state drive (SSD), or a hard disk drive (HDD), and stores the distance image processed by the distance image processing unit 4.

2. Circuit Configuration of Sensor Unit

Figure 2:
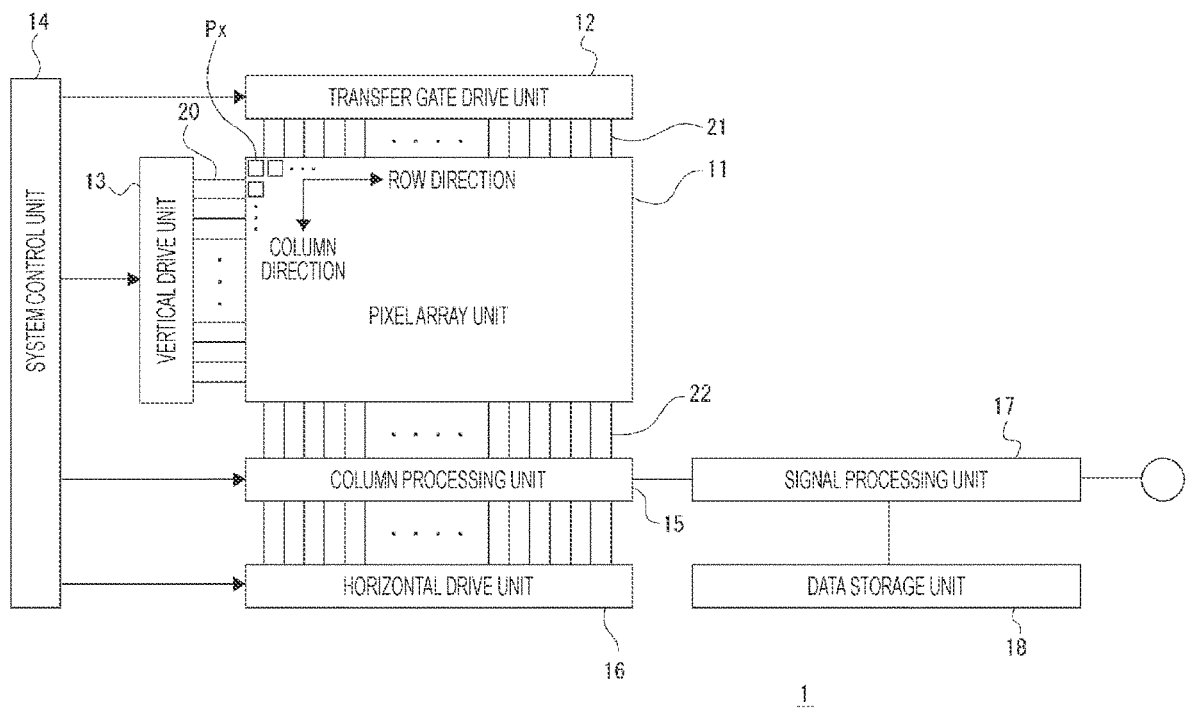
FIG. 2 is a block diagram illustrating an internal circuit configuration example of a sensor device (sensor unit) as the embodiment.

FIG. 2 is a block diagram illustrating an internal circuit configuration example of the sensor unit 1.

As illustrated, the sensor unit 1 includes a pixel array unit 11, a transfer gate drive unit 12, a vertical drive unit 13, a system control unit 14, a column processing unit 15, a horizontal drive unit 16, a signal processing unit 17, and a data storage unit 18.

The pixel array unit 11 has a configuration in which a plurality of pixels Px is two-dimensionally arranged in a matrix in a row direction and a column direction. Each pixel Px includes a photodiode PD as described later as a photo-electric conversion element. Note that details of the pixel Px will be described again with reference to FIG. 3.

Here, the row direction refers to an arrangement direction of the pixels Px in a horizontal direction, and the column direction refers to an arrangement direction of the pixels Px in a vertical direction. In the drawings, the row direction is a lateral direction, and the column direction is a longitudinal direction.

Note that, in this example, a formation pitch of the pixels Px in the pixel array unit 11 is 5.0 μm or less. Specifically, in this example, the formation pitch of the pixels Px is about 3.5 μm.

In the pixel array unit 11, with respect to a matrix-like pixel array, a pixel drive line 20 is wired along the row direction for every pixel row, and two gate drive lines 21 and two vertical signal lines 22 are each wired along the column direction for each pixel column. For example, the pixel drive line 20 transmits a drive signal for performing driving when reading a signal from the pixel Px. Note that, in FIG. 2, the pixel drive line 20 is illustrated as one wire but is not limited to one. One end of the pixel drive line 20 is connected to an output terminal corresponding to each row of the vertical drive unit 13.

The system control unit 14 includes a timing generator that generates various timing signals and the like, and performs drive control of the transfer gate drive unit 12, the vertical drive unit 13, the column processing unit 15, the horizontal drive unit 16, and the like on the basis of the various timing signals generated by the timing generator.

The transfer gate drive unit 12 drives two transfer gate elements provided in every pixel Px through the two gate drive lines 21 provided in each pixel column as described above on the basis of control of the system control unit 14.

As described above, the two transfer gate elements are alternately turned on in every modulation period Pm. Thus, the system control unit 14 controls on/off timings of the two transfer gate elements by the transfer gate drive unit 12 on the basis of the synchronization signal Ss described in FIG. 1.

The vertical drive unit 13 includes a shift register, an address decoder, and the like, and drives the pixels Px of the pixel array unit 11 at the same time for all the pixels or in units of rows. That is, the vertical drive unit 13 constitutes a drive unit that controls operation of each pixel Px of the pixel array unit 11 together with the system control unit 14 that controls the vertical drive unit 13.

A detection signal output (read) from each pixel Px of the pixel row according to drive control by the vertical drive unit 13, specifically, a signal corresponding to the signal charges accumulated in each of the two floating diffusions provided in every pixel Px is input to the column processing unit 15 through the corresponding vertical signal line 22. The column processing unit 15 performs predetermined signal processing on the detection signal read from each pixel Px through the vertical signal line 22, and temporarily holds the detection signal after the signal processing. Specifically, the column processing unit 15 performs noise removal processing, analog to digital (A/D) conversion processing, and the like as the signal processing.

Here, reading of two detection signals (detection signals of every floating diffusion) from each pixel Px is performed once for every predetermined number of repeated light emission of the irradiation light Li (every several thousand times to several tens of thousands of times of repeated light emission described above).

Therefore, the system control unit 14 also controls the vertical drive unit 13 on the basis of the synchronization signal Ss for timing of reading the detection signals from each pixel Px.

The horizontal drive unit 16 includes a shift register, an address decoder, and the like, and sequentially selects unit circuits corresponding to pixel columns of the column processing unit 15. By selective scanning by the horizontal drive unit 16, the detection signals subjected to the signal processing in every unit circuit in the column processing unit 15 are sequentially output.

The signal processing unit 17 has at least an arithmetic processing function, and performs various types of signal processing such as calculation processing of a distance corresponding to the indirect ToF method on the basis of the detection signals output from the column processing unit 15. Note that a known method can be used as a method of calculating distance information by the indirect ToF method on the basis of two types of detection signals (detection signals of every floating diffusion) for every pixel Px, and the description thereof will be omitted here.

The data storage unit 18 temporarily stores data necessary for signal processing in the signal processing unit 17.

The sensor unit 1 configured as described above outputs a distance image indicating the distance to the object Ob for every pixel Px. The distance measurement device 10 including such a sensor unit 1 can be applied to, for example, an in-vehicle system that is mounted on a vehicle and measures the distance to an object Ob outside the vehicle, a gesture recognition device that measures a distance to an object such as a hand of a user and recognizes a gesture of the user on the basis of a measurement result, and the like.

3. Circuit Configuration of Pixel Array Unit

Figure 3:
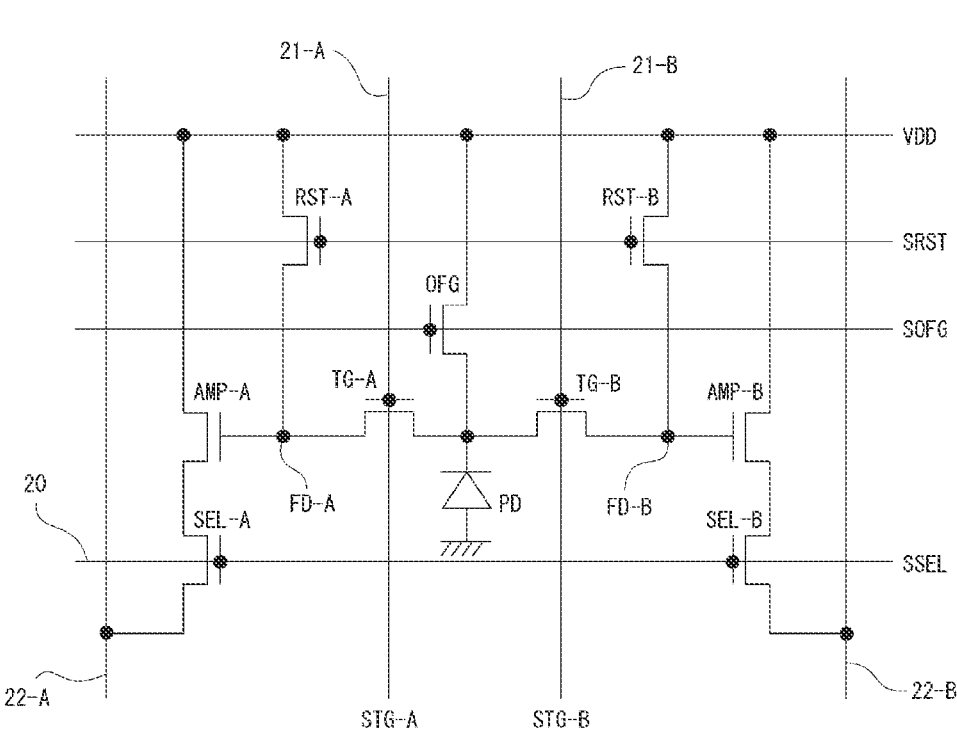
FIG. 3 is an equivalent circuit diagram of a pixel included in the sensor device as the embodiment.

FIG. 3 illustrates an equivalent circuit of the pixels Px two-dimensionally arranged in the pixel array unit 11.

A pixel Px includes one photodiode PD and one overflow (OF) gate transistor OFG as photoelectric conversion elements. Furthermore, the pixel Px includes two each of transfer transistors TG as the transfer gate elements, floating diffusions FD, reset transistors RST, amplification transistors AMP, and selection transistors SEL.

Here, in a case where the transfer transistors TG, the floating diffusions FD, the reset transistors RST, the amplification transistors AMP, and the selection transistors SEL provided two each in the pixel Px are distinguished from each other, as illustrated in FIG. 3, they are denoted as transfer transistors TG-A and TG-B, floating diffusions FD-A and FD-B, reset transistors RST-A and RST-B, amplification transistors AMP-A and RST-B, and selection transistors SEL-A and SEL-B.

The OF gate transistor OFG, the transfer transistors TG, the reset transistors RST, the amplification transistors AMP, and the selection transistors SEL include, for example, N-type MOS transistors.

The OF gate transistor OFG becomes conductive when an OF gate signal SOFG supplied to the gate is turned on. When the OF gate transistor OFG becomes conductive, the photodiode PD is clamped at a predetermined reference potential VDD, and the accumulated charges are reset.

Note that the OF gate signal SOFG is supplied from the vertical drive unit 13, for example.

The transfer transistor TG-A becomes conductive when a transfer drive signal STG-A supplied to the gate is turned on, and transfers the signal charges accumulated in the photodiode PD to the floating diffusion FD-A. The transfer transistor TG-B becomes conductive when a transfer drive signal STG-B supplied to the gate is turned on, and transfers the charges accumulated in the photodiode PD to the floating diffusion FD-B.

The transfer drive signals STG-A and STG-B are supplied from the transfer gate drive unit 12 through gate drive lines 21-A and 21-B, each of which is provided as one of the gate drive lines 21 illustrated in FIG. 2.

The floating diffusions FD-A and FD-B are charge holding units that temporarily hold the charges transferred from the photodiode PD.

The reset transistor RST-A becomes conductive when a reset signal SRST supplied to the gate is turned on, and resets the potential of the floating diffusion FD-A to the reference potential VDD. Similarly, the reset transistor RST-B becomes conductive when the reset signal SRST supplied to the gate is turned on, and resets the potential of the floating diffusion FD-B to the reference potential VDD.

Note that the reset signal SRST is supplied from the vertical drive unit 13, for example.

The amplification transistor AMP-A has a source connected to the vertical signal line 22-A via the selection transistor SEL-A, and a drain connected to the reference potential VDD (constant current source) to constitute a source follower circuit. The amplification transistor AMP-B has a source connected to the vertical signal line 22-B via the selection transistor SEL-B and a drain connected to the reference potential VDD (constant current source) to constitute a source follower circuit.

Here, each of the vertical signal lines 22-A and 22-B is provided as one of the vertical signal lines 22 illustrated in FIG. 2.

The selection transistor SEL-A is connected between the source of the amplification transistor AMP-A and the vertical signal line 22-A, becomes conductive when a selection signal SSEL supplied to the gate is turned on, and outputs the charges held in the floating diffusion FD-A to the vertical signal line 22-A via the amplification transistor AMP-A.

The selection transistor SEL-B is connected between the source of the amplification transistor AMP-B and the vertical signal line 22-B, becomes conductive when the selection signal SSEL supplied to the gate is turned on, and outputs the charges held in the floating diffusion FD-B to the vertical signal line 22-B via the amplification transistor AMP-A.

Note that the selection signal SSEL is supplied from the vertical drive unit 13 via the pixel drive line 20.

The operation of the pixel Px will be briefly described.

First, before light reception is started, a reset operation for resetting the charges in the pixel Px is performed in all the pixels. That is, for example, the OF gate transistor OFG, each reset transistor RST, and each transfer transistor TG are turned on (conductive state), and the accumulated charges of the photodiode PD and each floating diffusion FD are reset.

After resetting the accumulated charges, a light receiving operation for distance measurement is started in all the pixels. The light receiving operation mentioned here means a light receiving operation performed for one time of distance measurement. That is, during the light receiving operation, an operation of alternately turning on the transfer transistors TG-A and TG-B is repeated a predetermined number of times (in this example, about several thousand times to several tens of thousands of times). Hereinafter, a period of the light receiving operation performed for such one distance measurement is referred to as a "light receiving period Pr".

In the light receiving period Pr, in one modulation period Pm of the light emitting unit 2, for example, after a period in which the transfer transistor TG-A is turned on (that is, a period in which the transfer transistor TG-B is turned off) is continued over a light emitting period of the irradiation light Li, a remaining period, that is, a non-light emitting period of the irradiation light Li is a period in which the transfer transistor TG-B is turned on (that is, a period in which the transfer transistor TG-A is turned off). That is, in the light receiving period Pr, an operation of distributing the charges of the photodiode PD to the floating diffusions FD-A and FD-B is repeated a predetermined number of times within one modulation period Pm.

Then, when the light receiving period Pr ends, each pixel Px of the pixel array unit 11 is selected line by line. In the selected pixel Px, the selection transistors SEL-A and SEL-B are turned on. Thus, the charges accumulated in the floating diffusion FD-A are output to the column processing unit 15 via the vertical signal line 22-A. Furthermore, the charges accumulated in the floating diffusion FD-B are output to the column processing unit 15 via the vertical signal line 22-B.

As described above, one light receiving operation ends, and the next light receiving operation starting from the reset operation is executed.

Here, the reflected light received by the pixel Px is delayed according to the distance to the object Ob from the timing at which the light emitting unit 2 emits the irradiation light Li. A distribution ratio of the charges accumulated in the two floating diffusions FD-A and FD-B changes depending on a delay time according to the distance to the object Ob, and thus the distance to the object Ob can be obtained from the distribution ratio of the charges accumulated in the two floating diffusions FD-1 and FD-B.

4. Structure of Sensor Unit

The structure of the sensor unit 1 will be described with reference to FIGS. 4 to 6.

Figure 4:
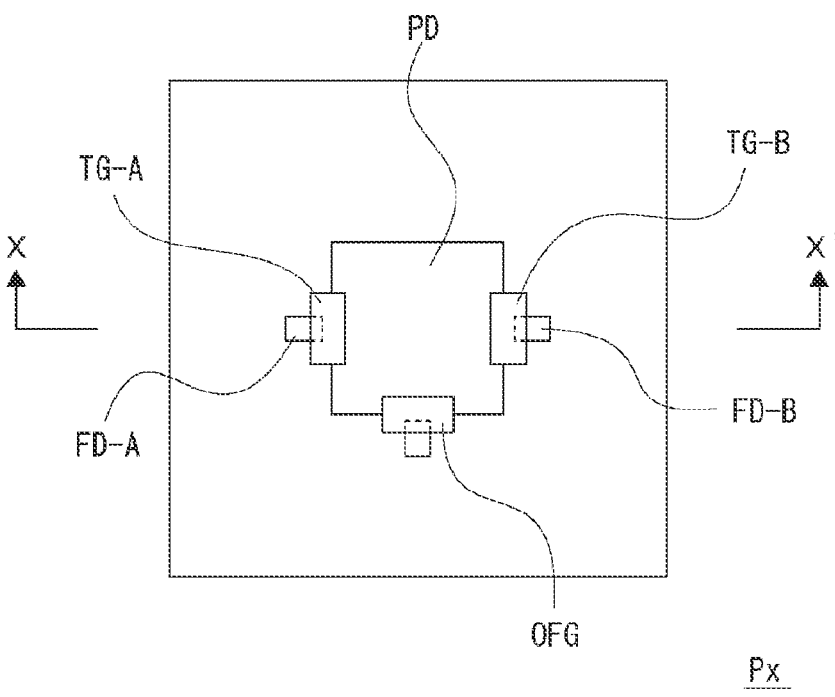
FIG. 4 is a top view illustrating a schematic structure of the pixel according to the embodiment.
Figure 5:
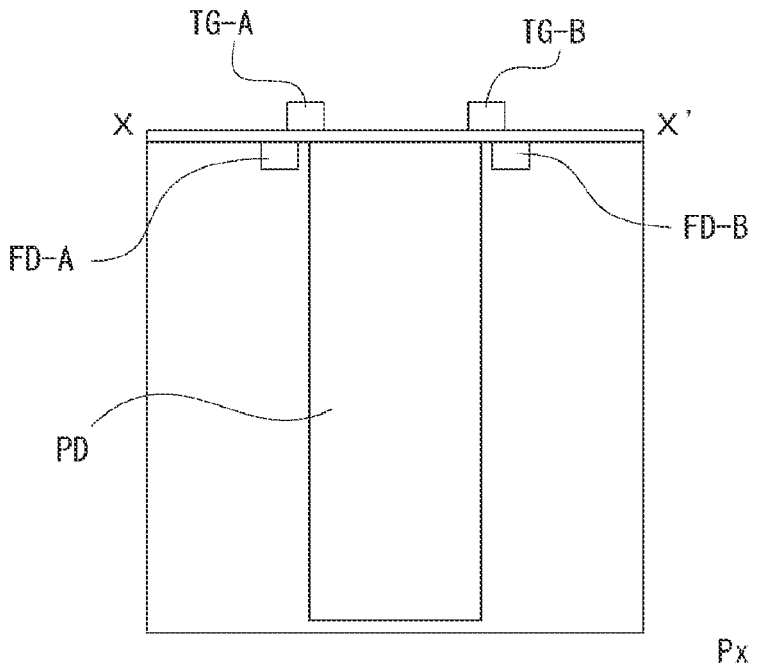
FIG. 5 is a cross-sectional view illustrating a schematic structure of the pixel according to the embodiment.

FIGS. 4 and 5 are views illustrating a schematic structure of the pixel Px, specifically, a positional relationship among the photodiode PD, the OF gate transistor OFG, the transfer transistors TG-A and TG-B, and the floating diffusions FD-A and FD-B formed in a region of one pixel Px in a semiconductor substrate, in which FIG. 4 is a top view, and FIG. 5 is a cross-sectional view taken along line X-X' illustrated in FIG. 4. Note that, in FIGS. 4 and 5, illustration of pixel transistors such as the reset transistor RST and the amplification transistor AMP is omitted.

The photodiode PD is formed inside the semiconductor substrate, has a substantially rectangular shape in top view, and is formed at a substantially center in plane of the pixel Px. Here, "in plane" means to be in a plane parallel to the horizontal direction (row direction) and the vertical direction (column direction) described above. Note that the horizontal direction corresponds to a lateral direction on the paper surface in FIGS. 4 and 5. The vertical direction corresponds to a longitudinal direction on the paper surface of FIG. 4.

The transfer transistors TG-A and TG-B are formed on the semiconductor substrate and have a substantially rectangular shape in top view. Positions of the transfer transistors TG-A and TG-B in plane are near a corresponding one end side portion of both end sides of the photodiode PD in the horizontal direction or the vertical direction. Specifically, in this example, the position of each of the transfer transistors TG-A and TG-B in plane is a position partially overlapping the corresponding one end side portion of the both end sides of the photodiode PD in the horizontal direction (lateral direction on the paper surface). Positions of the transfer transistors TG-A and TG-B in the vertical direction substantially coincide with each other.

The floating diffusions FD-A and FD-B are formed inside the semiconductor substrate and have a substantially rectangular shape in top view. The position of the floating diffusion FD-A in plane is set to a position partially overlapping an end side portion of an outside of the transfer transistor TG-A, that is, an end side portion opposite to an end side portion overlapping the photodiode PD as described above. Furthermore, the position of the floating diffusion FD-B in plane is set to a position partially overlapping an end side portion of an outside of the transfer transistor TG-B (an end side portion opposite to an end side portion overlapping the photodiode PD). The positions of the floating diffusions FD-A and FD-B in the vertical direction substantially coincide with each other.

The OF gate transistor OFG is formed on the semiconductor substrate and has a substantially rectangular shape in top view, and a position thereof in plane is a position partially overlapping an end side portion where the transfer transistors TG-A and TG-B do not overlap among four end side portions of the photodiode PD. That is, in this example, the photodiode PD is positioned so as to partially overlap one end side portion of both end side portions of the photodiode PD in the vertical direction.

Figure 6:
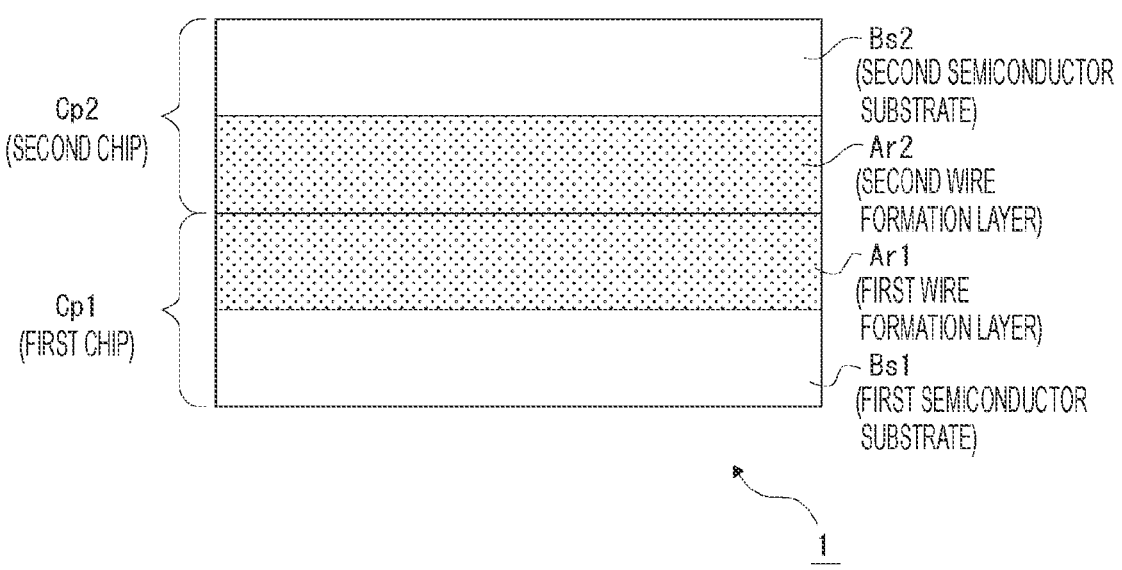
FIG. 6 is a schematic cross-sectional view illustrating a chip structure of the sensor device as the embodiment.

FIG. 6 is a schematic cross-sectional view illustrating a chip structure of the sensor unit 1.

The sensor unit 1 has a structure in which a first chip Cp1 and a second chip Cp2 are bonded together. The first chip Cp1 is a chip on which the pixel array unit 11 is formed among the components of the sensor unit 1 illustrated in FIG. 2 above. The second chip Cp2 is a chip in which a circuit unit other than the pixel array unit 11, that is, a circuit unit for pixel drive as the transfer gate drive unit 12, the vertical drive unit 13, the system control unit 14, the column processing unit 15, and the horizontal drive unit 16, and a circuit unit for distance calculation as the signal processing unit 17 and the data storage unit 18 are formed.

The first chip Cp1 includes a first semiconductor substrate Bs1 and a first wire formation layer Ar1 stacked on the first semiconductor substrate Bs1. The first semiconductor substrate Bs1 corresponds to the semiconductor substrate described in FIGS. 4 and 5. The first wire formation layer Ar1 is a layer in which various wires are formed, and is formed by stacking a plurality of wire layers.

The second chip Cp2 includes a second semiconductor substrate Bs2 and a second wire formation layer Ar2 stacked on the second semiconductor substrate Bs2. The second wire formation layer Ar2 is a layer in which various wires are formed similarly to the first wire formation layer Ar1, and is formed by stacking a plurality of wire layers.

The sensor unit 1 is formed by bonding the first chip Cp1 and the second chip Cp2 in a direction in which the first wire formation layer Ar1 in the first chip Cp1 and the second wire formation layer Ar2 in the second chip Cp2 face each other.

5. Inter-Chip Bonding as Embodiment

Here, in the present embodiment, the first chip Cp1 and the second chip Cp2 are bonded by bonding the wires formed in the first wire formation layer Ar1 and the wires formed in the second wire formation layer Ar2.

Figure 7:
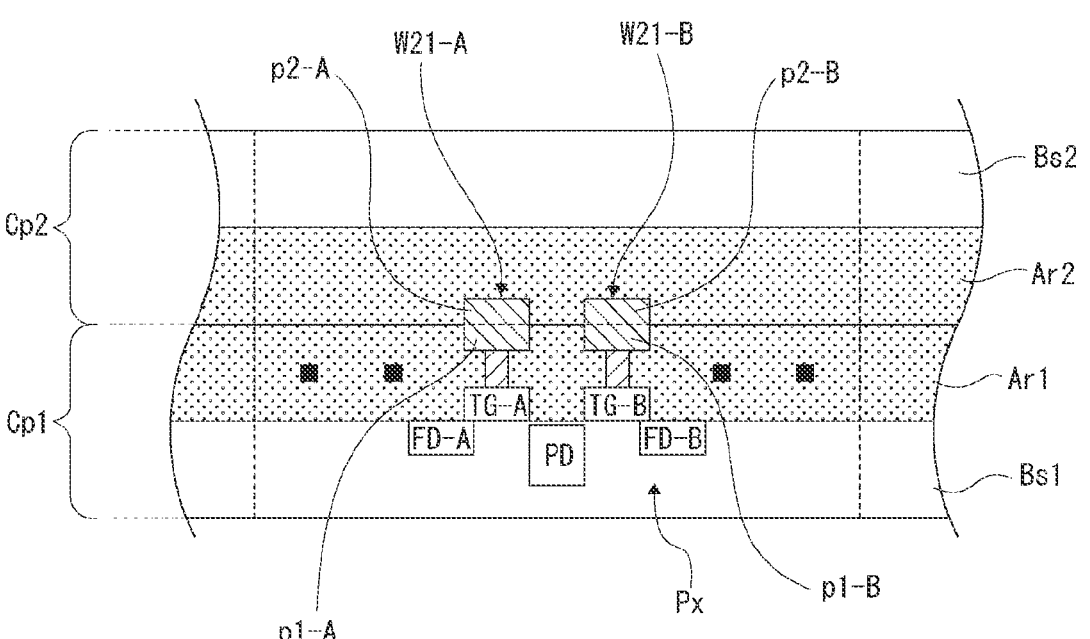
FIG. 7 is an explanatory view of bonding between chips by wires.

FIG. 7 is an explanatory view of bonding between chips by such wires, and schematically illustrates a state of a cross section of a region corresponding to one pixel Px in the sensor unit 1.

The inter-chip bonding wire W21-A and the inter-chip bonding wire W21-B in the view are wires that bond the first chip Cp1 and the second chip Cp2. The inter-chip bonding wire W21-A forms a part of the gate drive line 21-A (see FIG. 3) for supplying the transfer drive signal STG-A to the transfer transistor TG-A, and the inter-chip bonding wire W21-B forms a part of the gate drive line 21-B for supplying the transfer drive signal STG-B to the transfer transistor TG-B.

The inter-chip bonding wire W21-A is formed by bonding a first portion p1-A formed in the first wire formation layer Ar1 in the first chip Cp1 and a second portion p2-A formed in the second wire formation layer Ar2 in the second chip Cp2. The inter-chip bonding wire W21-B is formed by bonding a first portion p1-B formed in the first wire formation layer Ar1 and a second portion p2-B formed in the second wire formation layer Ar2.

In this example, a technique of copper-copper connection (Cu—Cu connection) is used as a technique of inter-chip bonding by each of the inter-chip bonding wires W21-A and W21-B. The Cu—Cu connection is a technique of bonding conductive materials including Cu formed on respective chips to ensure electrical conduction between these conductive materials and to achieve physical bonding between the chips.

Here, in the sensor unit 1 at the current development stage, the inter-chip bonding wires as the wires for bonding chips are only applied to the gate drive lines 21-A and 21-B like the inter-chip bonding wires W21-A and 21-B illustrated in FIG. 7, and a conventional local wire and an intermediate wire are applied to wires on the ground side (Vss wires). Here, the local wire and the intermediate wire are wires formed in a layer different from a layer in which the inter-chip bonding wire is formed in the first wire formation layer Ar1. The local wire means a wire completed in the pixel Px, and the intermediate wire means a wire formed across the pixels Px.

In the inter-chip bonding wire, a width and a cross-sectional area of the wire are considerably larger as compared with the local wire and the intermediate wire in order to secure bonding strength. Therefore, in a case where the inter-chip bonding wire is applied only to the gate drive lines 21-A and 21-B as described above, a difference in wire resistance (impedance mismatch) occurs between a drive signal wire side of the transfer transistor TG and a ground wire side, and a problem occurs that the ground potential becomes unstable due to the difference in wire resistance.

Figure 8:
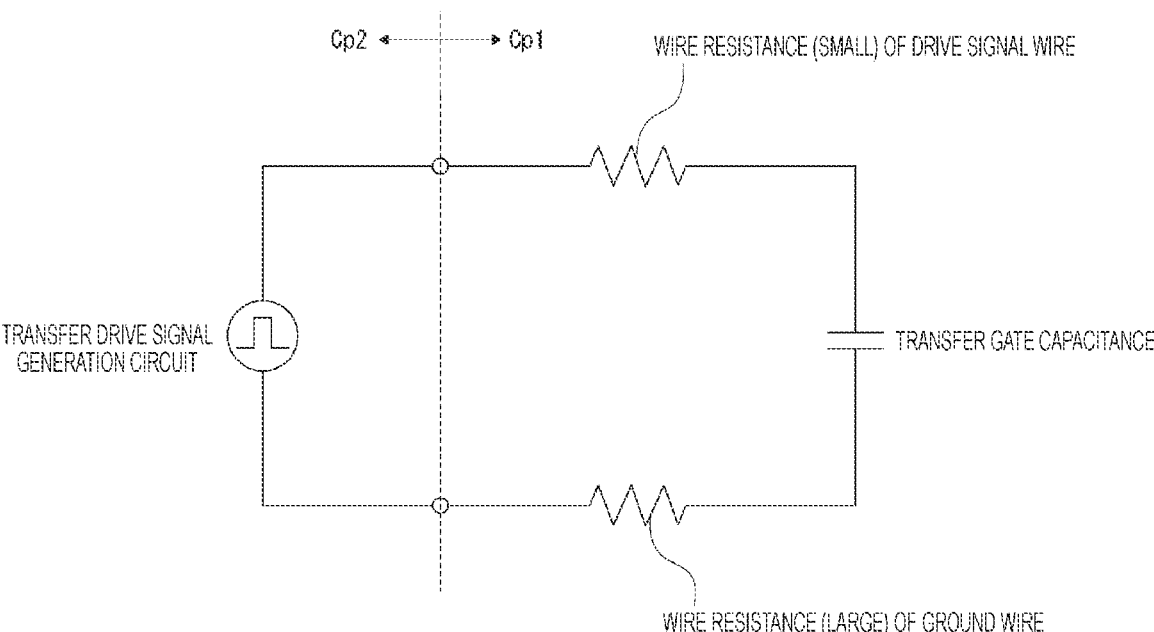
FIG. 8 is an equivalent circuit diagram of a circuit system related to driving of a transfer gate element.

FIG. 8 is an equivalent circuit diagram of a circuit system related to drive of the transfer transistor TG.

In FIG. 8, a boundary portion between the first chip Cp1 and the second chip Cp2 is schematically represented by a dotted line. A transfer drive signal STG for driving the transfer transistor TG is generated in a transfer drive signal generation circuit (transfer gate drive unit 12) provided on the second chip Cp2 side.

As illustrated in this equivalent circuit diagram, a capacitance as a transfer gate capacitance is generated in the transfer transistor TG. Therefore, as described above, due to that there is a difference in wire resistance between the drive signal wire and a ground wire, specifically, the wire resistance of the drive signal wire is small and the wire resistance of the ground wire is large as illustrated in the diagram, the voltage on the drive signal wire side instantaneously decreases when the transfer transistor TG turns off, and meanwhile charges remain in the transfer gate capacitance. Thus, on the ground wire side, potential of the ground fluctuates to the negative polarity side from 0 V due to the influence of the remaining charges.

Figure 9:
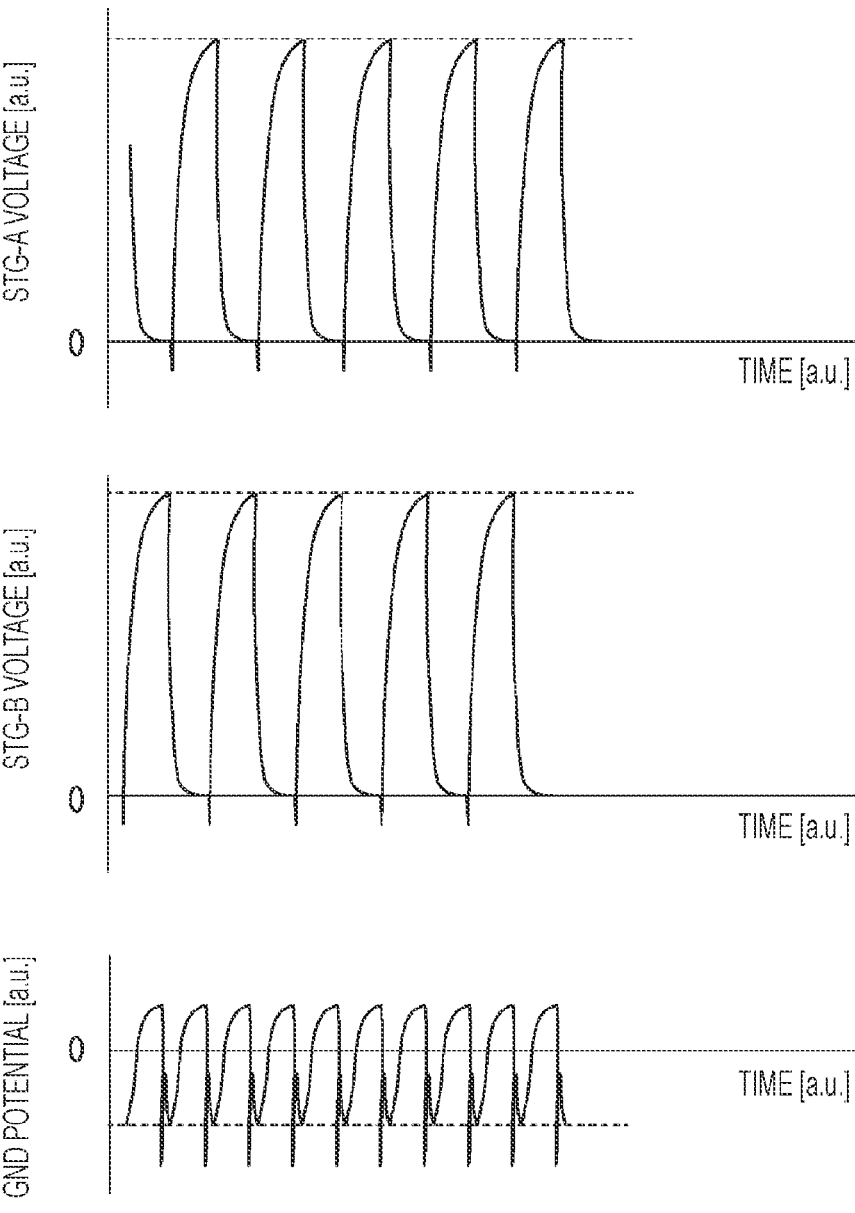
FIG. 9 is a chart illustrating waveform images of transfer drive signals and a ground potential.

FIG. 9 illustrates waveform images of changes in voltages of the transfer drive signals STG-A and STG-B and the ground potential at this time.

As described above, since the ground potential fluctuates to the negative polarity side and becomes unstable, the voltages of the transfer drive signals STG-A and STG-B also relatively change, and accuracy of operation of the transfer transistors TG-A and TG-B is impaired. Since the transfer transistors TG-A and TG-B do not operate accurately, accuracy of charge distributing operation to the two floating diffusions FD-A and FD-B is also impaired, which consequently leads to deterioration of distance measurement performance.

Figure 10:
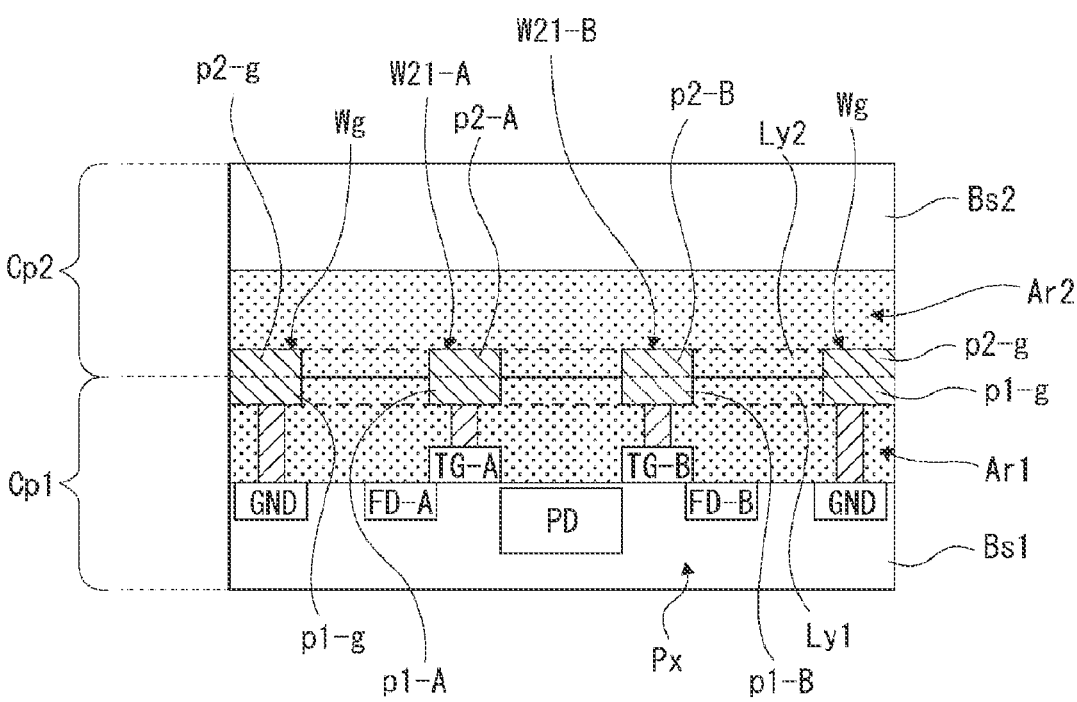
FIG. 10 is a cross-sectional view for explaining a method of inter-chip bonding as the embodiment.

Accordingly, in the present embodiment, as illustrated in the cross-sectional view of FIG. 10, the inter-chip bonding wire is also applied to the ground wire side. Note that FIG. 10 schematically illustrates a state of a cross section of a region corresponding to one pixel Px in the sensor unit 1, similarly to FIG. 7 above.

In the sensor unit 1 of the present embodiment, an inter-chip bonding wire Wg in the drawings is provided as an inter-chip bonding wire electrically connected to the ground. The inter-chip bonding wire Wg is an inter-chip bonding wire by Cu—Cu connection as in the inter-chip bonding wires W21-A and 21-B, and is formed by bonding a first portion p1-g formed in the first wire formation layer Ar1 and a second portion p2-g formed in the second wire formation layer Ar2.

By applying the inter-chip bonding wire also on the ground wire side, the drive signal wire of the transfer transistor TG and the ground wire include the same type of wire as the inter-chip bonding wire, and the wire resistances of the drive signal wire and the ground wire can be made equal.

Therefore, the accuracy of operation of the transfer transistors TG-A and TG-B can be prevented from being impaired due to the wire resistances becoming unbalanced between the drive signal wire and the ground wire (occurrence of impedance mismatch), and the distance measurement performance can be improved.

Here, as illustrated in FIG. 10, the first wire formation layer Ar1 in the first chip Cp1 has a wire layer in which the respective first portions (p1-A, p1-B, and p1-g) of the inter-chip bonding wires W21-A, W21-B, and Wg are formed, and this wire layer is hereinafter referred to as a "wire layer Ly1".

Furthermore, the second wire formation layer Ar2 in the second chip Cp2 has a wire layer in which the respective second portions (p2-A, p2-B, and p2-g) of the inter-chip bonding wires W21-A, W21-B, and Wg are formed, and this wire layer is hereinafter referred to as a "wire layer Ly2".

Figure 11:
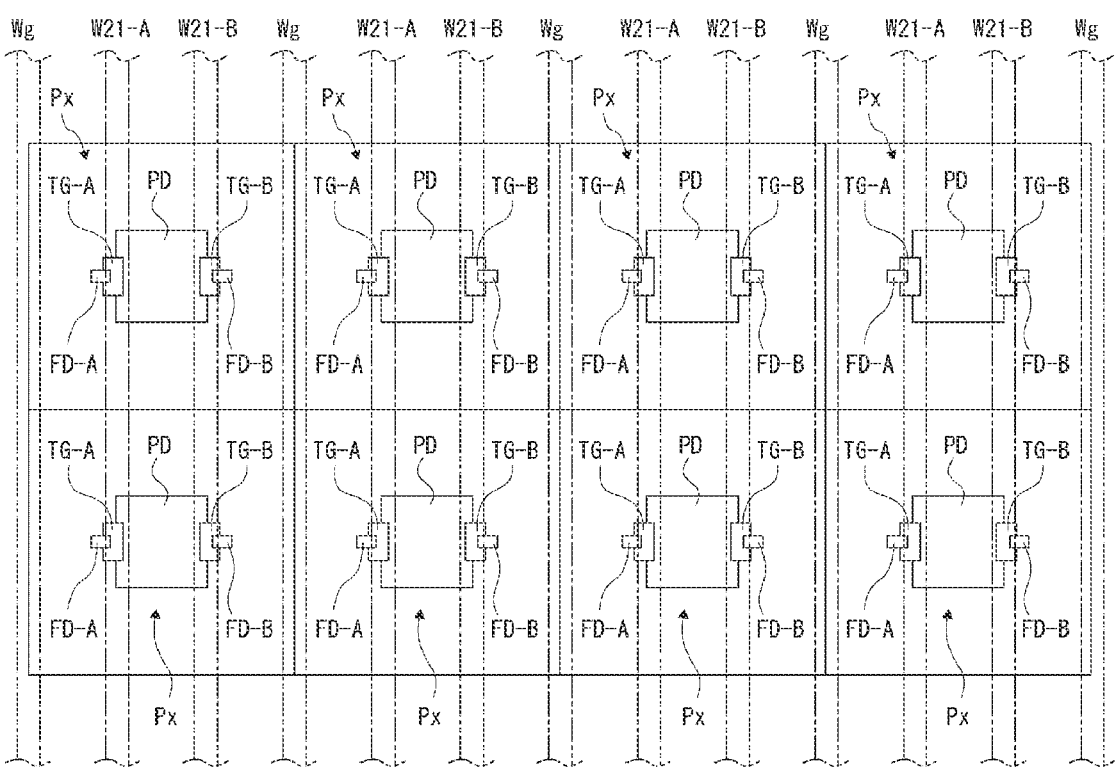
FIG. 11 is a view illustrating a disposition example of the inter-chip bonding wires in the pixel array unit.

FIG. 11 illustrates a disposition example of the inter-chip bonding wires W21-A, W21-B, and Wg in the pixel array unit 11.

Each of the inter-chip bonding wires W21-A, W21-B, and Wg is disposed as a wire extending in the vertical direction (column direction) of the pixel array unit 11. In this example, two inter-chip bonding wires Wg are formed so as to pass through each pixel Px. Specifically, one inter-chip bonding wire Wg is disposed in each boundary region between the pixels Px in an adjacent relationship in the horizontal direction as illustrated, and two inter-chip bonding wires Wg are formed so as to pass through each pixel Px.

Wire widths of the inter-chip bonding wires W21-A, W21-B, and Wg are substantially the same in this example. Thus, respective wire resistances of the inter-chip bonding wires W21-A, W21-B, and Wg can be made equal, and it is possible to prevent the wire resistances from becoming unbalanced among these inter-chip bonding wires W21-A, W21-B, and Wg to thereby impair the accuracy of operation of the transfer transistors TG-A and TG-B.

Furthermore, in this example, cross-sectional areas of the inter-chip bonding wires W21-A, W21-B, and Wg are substantially the same. Thus, the respective wire resistances of the inter-chip bonding wires W21-A, W21-B, and Wg can be made equal, and it is possible to prevent the wire resistances from becoming unbalanced among the inter-chip bonding wires W21-A, W21-B, and Wg to thereby impair the accuracy of operation of the transfer transistors TG-A and TG-B.

Furthermore, in this example, an interval between the inter-chip bonding wire W21-A and the inter-chip bonding wire Wg adjacent to the inter-chip bonding wire W21-A is substantially equal to an interval between the inter-chip bonding wire W21-B and the inter-chip bonding wire Wg adjacent to the inter-chip bonding wire W21-B. The "interval" between adjacent wires mentioned here means an interval between adjacent ends of both wires. Note that a term "arrangement interval" of wires means an interval between centers of the wires.

As described above, since the interval between the inter-chip bonding wires W21-A and Wg and the interval between the inter-chip bonding wires W21-B and Wg are substantially equal, a line-to-line capacitance between the inter-chip bonding wire W21-A and the inter-chip bonding wire Wg (that is, parasitic capacitance acting on the inter-chip bonding wire W21-A) and a line-to-line capacitance between the inter-chip bonding wire W21-B and the inter-chip bonding wire Wg (that is, parasitic capacitance acting on the inter-chip bonding wire W21-B) are substantially equal. In the drive signals (drive pulses) of the transfer transistors TG-A and TG-B, waveform blunting occurs due to the line-to-line capacitance with the inter-chip bonding wire Wg. However, since the line-to-line capacitances are substantially equal as described above, it is possible to prevent blunting of drive waveforms of the transfer transistors TG-A and TG-B from becoming unbalanced, and it is possible to accurately perform charge distribution to the two floating diffusions FD-A and FD-B.

Note that, as described above, in this example, since the wire widths of the inter-chip bonding wires W21-A, W21-B, and Wg are substantially the same, the interval between the inter-chip bonding wires W21-A and Wg and the interval between the inter-chip bonding wires W21-B and Wg are substantially equal as described above, so that arrangement intervals between the inter-chip bonding wires W21-A, W21-B, and Wg are substantially equal.

Furthermore, in addition, in this example, at least a part of the inter-chip bonding wire W21-A overlaps the transfer transistor TG-A, and at least a part of the inter-chip bonding wire W21-B overlaps the transfer transistor TG-B in an in-plane direction. Note that, the in-plane direction can be rephrased as a direction orthogonal to the stacking direction of the first chip Cp1 and the second chip Cp2.

An advantage of overlapping a part of the inter-chip bonding wires W21-A and W21-B with a part of the transfer transistors TG-A and TG-B in this manner will be described below.

Figure 12:
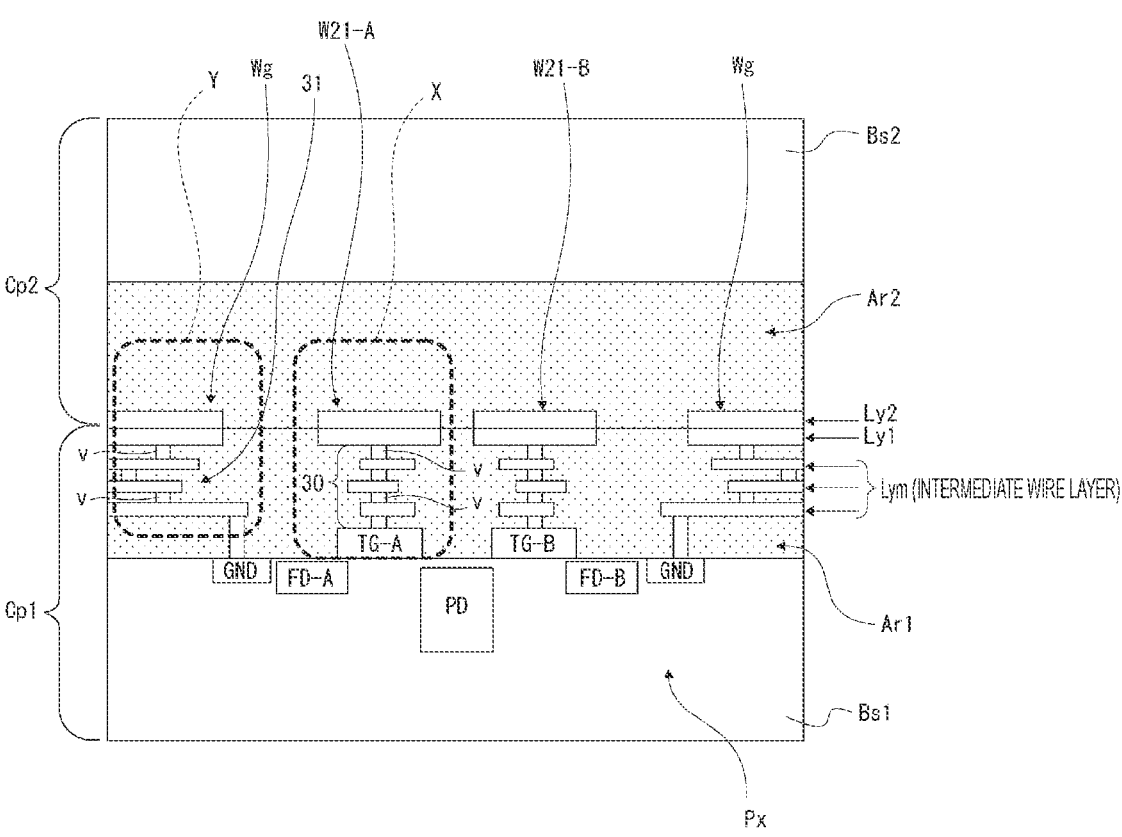
FIG. 12 is a view for explaining a schematic cross-sectional structure of the sensor unit corresponding to the disposition example of the wires illustrated in FIG. 11.

FIG. 12 is a view for explaining a schematic cross-sectional structure of the sensor unit 1 corresponding to the disposition example of the wires illustrated in FIG. 11, and schematically illustrates a state of a cross section of a region corresponding to one pixel Px in the sensor unit 1. Specifically, respective specific structure examples of a wire connecting the inter-chip bonding wire W21-A and the transfer transistor TG-A, a wire connecting the inter-chip bonding wire W21-B and the transfer transistor TG-B, and a wire connecting the inter-chip bonding wire Wg and the ground in the pixel Px are illustrated.

Hereinafter, a wire layer other than the wire layer Ly1 in the first wire formation layer Ar1 is referred to as an "intermediate wire layer Lym".

Furthermore, a wire connecting the inter-chip bonding wire W21-A and the transfer transistor TG-A is referred to as a "first intermediate wire", and a wire connecting the inter-chip bonding wire W21-B and the transfer transistor TG-B is referred to as a "second intermediate wire".

In the intermediate wire layer Lym, a local wire and an intermediate wire that function as a part of the drive signal wire of each of the transfer transistors TG-A and TG-B, and a local wire and an intermediate wire that function as a part of the ground wire are formed.

In this example, at least a part of the inter-chip bonding wire W21-A overlaps the transfer transistor TG-A in the in-plane direction as described above. Therefore, as surrounded by a thick broken line X in the view, the first intermediate wire connecting the inter-chip bonding wire W21-A and the transfer transistor TG-A can be formed as a connection portion 30 extending substantially linearly in the stacking direction of the first chip Cp1 and the second chip Cp2. Specifically, the connection portion 30 includes a plurality of vias v penetrating between the intermediate wire layers Lym, and for example, central axes of the vias v substantially coincide with each other, so that the connection portion 30 extends substantially linearly in the stacking direction. Note that the number of vias v of the connection portion 30 is not limited to a plurality, and may be single.

Furthermore, in this example, at least a part of the inter-chip bonding wire W21-B overlaps the transfer transistor TG-B in the in-plane direction also on the transfer transistor TG-B side, and thus, although illustration of reference numerals is omitted, similar connection by the connection portion 30 is performed also on the transfer transistor TG-B side.

By forming the connection portion 30 extending substantially linearly in the stacking direction as described above, respective wire lengths of the first intermediate wire and the second intermediate wire can be set to a length corresponding to the separation distance in the stacking direction between the inter-chip bonding wire W21-A and the transfer transistor TG-A and a length corresponding to the separation distance in the stacking direction between the inter-chip bonding wire W21-B and the transfer transistor TG-B, and the wire resistances of the first and second intermediate wires can be minimized.

Therefore, blunting of the drive waveforms of the transfer transistors TG-A and TG-B can be suppressed, and the transfer drive signals STG-A and STG-B with higher frequencies can be transmitted.

Furthermore, in this example, at least a part of the inter-chip bonding wire W21-A overlaps the transfer transistor TG-A and at least a part of the inter-chip bonding wire W21-B overlaps the transfer transistor TG-B in the in-plane direction, so that it is possible to form the connection portion 30 extending substantially linearly in the stacking direction as described above. However, this eliminates the need to route each of the first intermediate wire and the second intermediate wire in the in-plane direction (see FIGS. 11 and 12), and the wire resistances of the first and second intermediate wires can be reduced. Furthermore, a line-to-line capacitance with the adjacent wire can also be reduced.

Since the wire resistance and the line-to-line capacitance can be reduced, blunting of the drive waveforms of the transfer transistors TG-A and TG-B can be suppressed, and the transfer drive signals STG-A and STG-B with higher frequencies can be transmitted.

Furthermore, in this example, as surrounded by a thick broken line Y in the drawings, the inter-chip bonding wire Wg is connected to the intermediate ground wire 31 in the pixel Px. The intermediate ground wire 31 is a wire formed in the intermediate wire layer Lym and connected to the ground in the pixel Px. In this example, the intermediate ground wire 31 extends in the vertical direction so as to run side by side with the inter-chip bonding wire Wg at the end in the horizontal direction of the pixel Px. Then, in this example, the intermediate ground wire 31 and the inter-chip bonding wire Wg as described above are connected in each pixel Px.

Since the inter-chip bonding wire Wg is connected to the intermediate ground wire 31 in the pixel Px as described above, the cross-sectional area of the inter-chip bonding wire Wg (ground wire) can be increased.

Since the cross-sectional area of the ground wire can be increased, the wire width of the ground wire can be narrowed without increasing the impedance. By narrowing the wire width of the ground wire, the line-to-line capacitance between the inter-chip bonding wires W21-A and W21-B and the ground wire can be reduced, and the waveform blunting of the drive pulse can be suppressed.

6. Modification Example Relating to Disposition of Inter-Chip Bonding Wire

Figure 13:
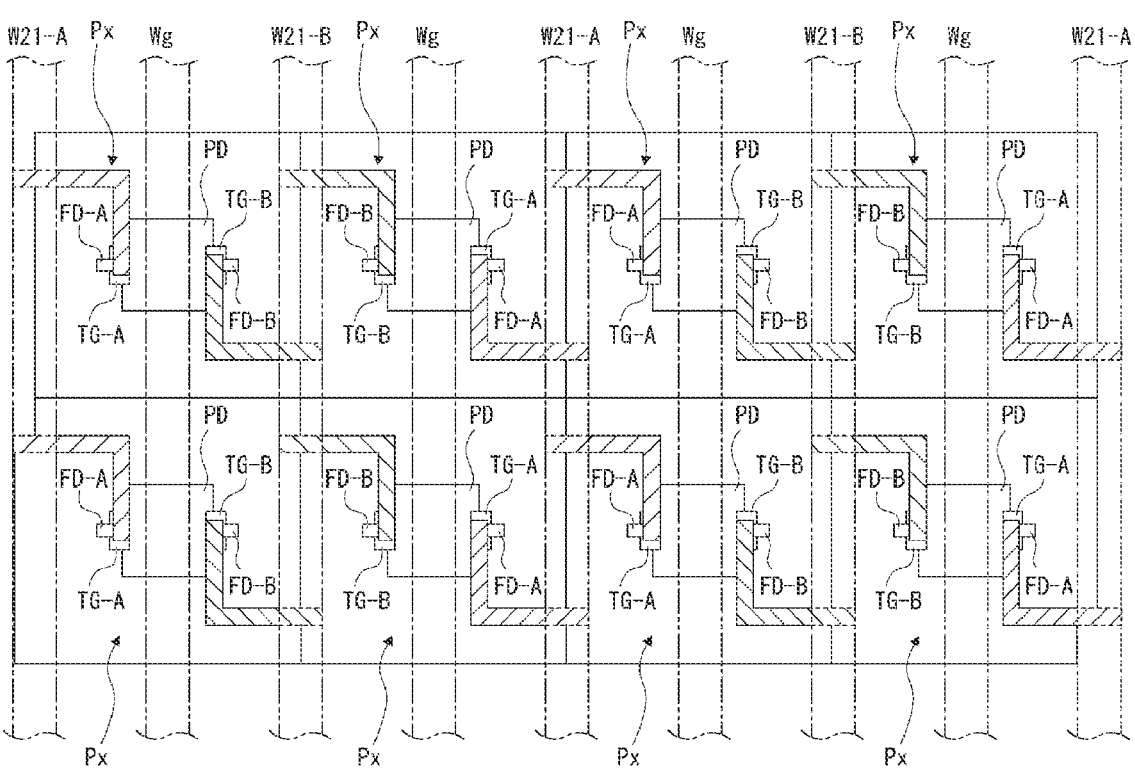
FIG. 13 is an explanatory view of a first modification example relating to disposition of inter-chip bonding wires.

FIG. 13 is an explanatory view of a first modification example relating to disposition of the inter-chip bonding wires.

In the first modification example, the formation pitch of the inter-chip bonding wires, which is 3 per pixel in FIG. 11, is set to 2 per pixel.

Specifically, the arrangement of the inter-chip bonding wires in the horizontal direction in this case is an arrangement in which the inter-chip bonding wires W21-A and W21-B are alternately arranged, and then the inter-chip bonding wires Wg are arranged between the inter-chip bonding wires W21-A and W21-B.

In this case, each of the arrangement interval of the inter-chip bonding wires W21-A and the arrangement interval of the inter-chip bonding wires W21-B is an interval of every two pixels, and the arrangement interval of the inter-chip bonding wires Wg is an interval of every one pixel.

As illustrated, each of the inter-chip bonding wires W21-A and W21-B is arranged in a boundary portion between two adjacent pixels Px in the horizontal direction, and is formed so as to overlap each of the two adjacent pixels Px. Furthermore, the inter-chip bonding wire Wg is disposed so as to be located at a center of each pixel Px in the horizontal direction. In this example, the wire widths of the inter-chip bonding wires W21-A, W21-B, and Wg are substantially the same.

Note that, in the first modification example, due to the relationship in which the inter-chip bonding wires W21-A and W21-B are alternately arranged, a structure is employed in which formation positions of the transfer transistors TG-A and TG-B are reversed between two pixels Px adjacent in the horizontal direction.

In the first modification example, in each pixel Px, the inter-chip bonding wires W21-A and W21-B are symmetrically arranged with the photodiode PD interposed therebetween. Specifically, the inter-chip bonding wires W21-A and W21-B are arranged in line symmetry with respect to a center line of the photodiode PD in the horizontal direction.

Since the inter-chip bonding wires W21-A and W21-B are arranged symmetrically with the photodiode PD interposed therebetween, wire lengths can be made equal and wire resistances can be made equal with respect to the first intermediate wire (represented by left-downward oblique lines in the view) connecting the transfer transistor TG-A and the inter-chip bonding wire W21-A and the second intermediate wire (represented by right-downward oblique lines in the view) connecting the transfer transistor TG-B and the inter-chip bonding wire W21-B.

Therefore, the drive signal is prevented from becoming unbalanced between the transfer transistors TG-A and TG-B, and the charge distribution to the two floating diffusions FD-A and FD-B can be accurately performed.

Note that, for confirmation, the configuration illustrated in FIG. 11 above also corresponds to a configuration in which the inter-chip bonding wires W21-A and W21-B are symmetrically arranged with the photodiode PD interposed therebetween.

Furthermore, in the first modification example, as in the case of FIG. 11 above, the interval between the inter-chip bonding wires W21-A and Wg is substantially equal to the interval between the inter-chip bonding wires W21-B and Wg.

Therefore, also in the first modification example, the line-to-line capacitance between the inter-chip bonding wire W21-A and the inter-chip bonding wire Wg and the line-to-line capacitance between the inter-chip bonding wire W21-B and the inter-chip bonding wire Wg can be made substantially equal.

Figure 14:
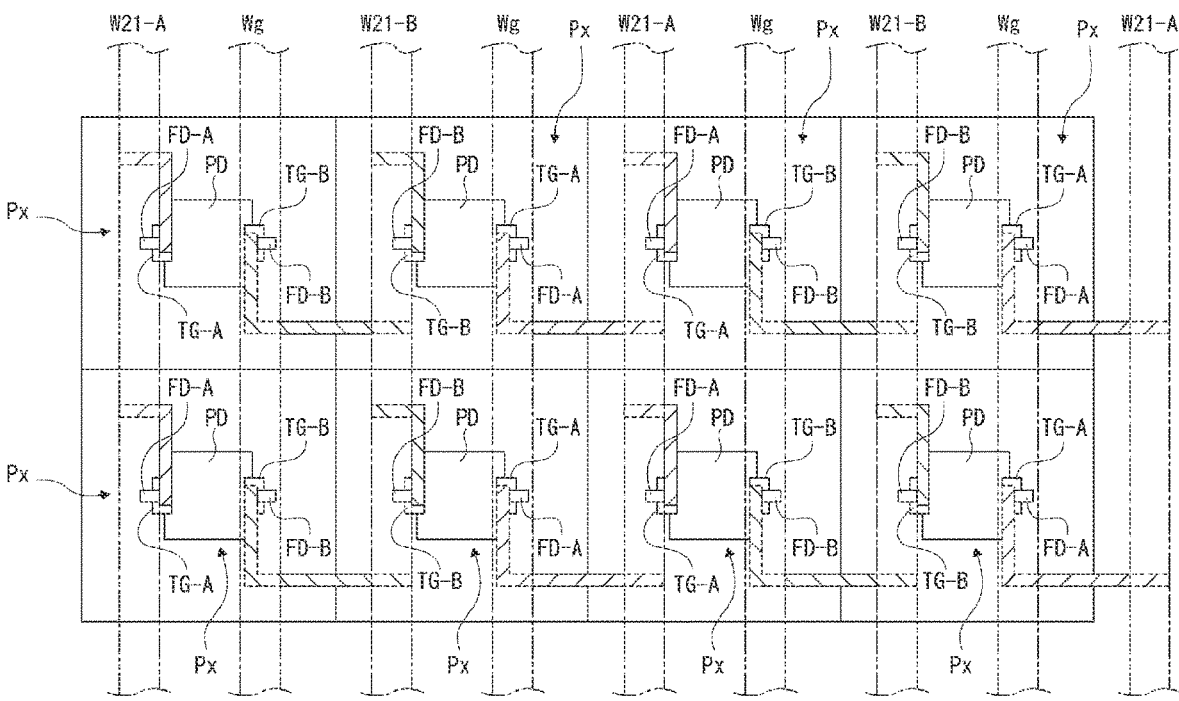
FIG. 14 is an explanatory view of a second modification example relating to the disposition of the inter-chip bonding wires.

FIG. 14 is an explanatory view of a second modification example relating to the disposition of the inter-chip bonding wires.

A difference from the first modification example illustrated in FIG. 13 is that each of the inter-chip bonding wires W21-A and W21-B is disposed so as to partially overlap the corresponding transfer transistor TG in the horizontal direction. That is, the inter-chip bonding wire W21-A is disposed so as to partially overlap the transfer transistor TG-A, and the inter-chip bonding wire W21-B is disposed so as to partially overlap the transfer transistor TG-B.

As in the case of FIG. 13, the second modification example also satisfies the condition that the interval between the inter-chip bonding wires W21-A and Wg and the interval between the inter-chip bonding wires W21-B and Wg are substantially equal. Therefore, by arranging the inter-chip bonding wires W21-A and W21-B as described above, the inter-chip bonding wire Wg in this case is disposed not at the center of the pixel Px in the horizontal direction but at a position shifted from the center in the horizontal direction.

Figure 15:
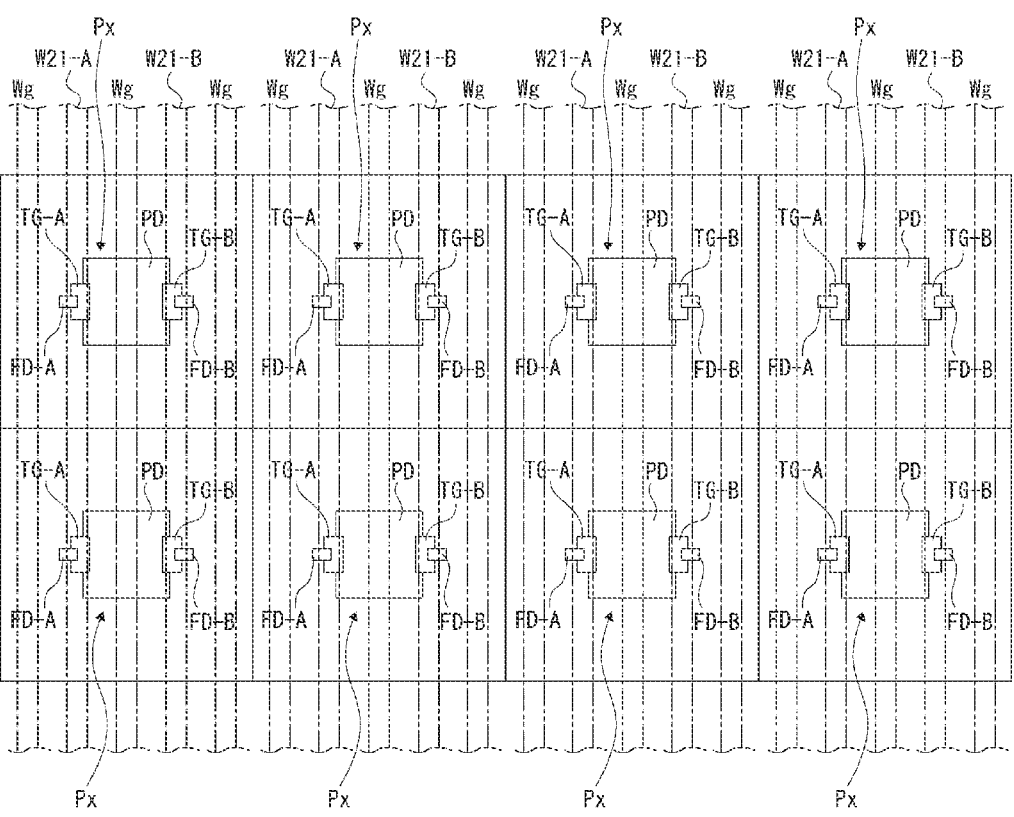
FIG. 15 is an explanatory view of a third modification example relating to the disposition of the inter-chip bonding wires.

FIG. 15 is an explanatory view of a third modification example relating to the disposition of the inter-chip bonding wires.

In the third modification example, the formation pitch of the inter-chip bonding wires is narrowed to five formation pitches per pixel. Specifically, breakdowns of the five inter-chip bonding wires for every pixel Px in this case include one each of the inter-chip bonding wires W21-A and W21-B and three inter-chip bonding wires Wg, and as illustrated, each of the inter-chip bonding wires W21-A and W21-B is disposed at a position partially overlapping the corresponding transfer transistor TG as in the case of FIG. 11, and regarding the inter-chip bonding wires Wg, one is disposed between the inter-chip bonding wires W21-A and W21-B, one is disposed outside the inter-chip bonding wire W21-A, and one is disposed outside the inter-chip bonding wire W21-B.

By narrowing the formation pitch of the inter-chip bonding wires, bonding strength between the chips can be improved.

7. Other Modification Examples

Note that the embodiment is not limited to the specific examples described above, and various modification examples can be employed.

For example, the example in which the inter-chip bonding wires are arranged in the horizontal direction has been described above, but the inter-chip bonding wires may be arranged in the vertical direction. Furthermore, each inter-chip bonding wire is illustrated as a wire extending linearly, but a part thereof may be bent or curved, or a part thereof may be extended in an oblique direction.

Furthermore, the formation pitch of the inter-chip bonding wires is not limited to those exemplified above.

Here, as described above, the formation pitch of the pixels Px in this example is 5.0 μm or less, specifically, about 3.5 μm, and in this case, the formation pitch of the inter-chip bonding wires is approximately 1.7 (5.0÷3) μm or less, specifically, approximately 1.2 μm (3.5÷3) with the ratio of 3 per pixel illustrated in FIG. 11 above. Furthermore, in a case where the ratio is 2 per pixel illustrated in FIG. 13, the formation pitch of the inter-chip bonding wires is 2.5 (5.0÷2) μm or less, specifically, approximately 1.8 μm (3.5÷2).

Furthermore, in the above description, an example has been described in which the signal processing unit 17 that performs calculation for calculating the distance is provided in the sensor unit 1, but the signal processing unit 17 may be provided outside the sensor unit 1.

8. Summary of Embodiment

As described above, the sensor device (sensor unit 1) according to the embodiment includes a first chip (Cp1) including a first semiconductor substrate (Bs1) and a first wire formation layer (Ar1) and including a pixel that includes a photoelectric conversion element (photodiode PD), and a first transfer gate element (transfer transistor TG-A) and a second transfer gate element (transfer transistor TG-B) configured to transfer accumulated charges of the photoelectric conversion element, and a second chip (Cp2) including a second semiconductor substrate (Bs2) and a second wire formation layer (Ar2).

Then, a first wire (inter-chip bonding wire W21-A) electrically connected to the first transfer gate element, a second wire (inter-chip bonding wire W21-B) electrically connected to the second transfer gate element, and a third wire (inter-chip bonding wire Wg) electrically connected to a ground are formed, and each of the first wire, the second wire, and the third wire is formed by bonding a first portion (p1-A, p1-B, and p1-g) formed in the first wire formation layer and extending in a first direction and a second portion (p2-A, p2-B, and p2-g) formed in the second wire formation layer and extending in the first direction.

According to the above configuration, the first wire for the first transfer gate element, the second wire for the second transfer gate element, and the third wire as a ground wire are formed together as inter-chip bonding wires for bonding the first chip and the second chip. That is, by forming the first wire, the second wire, and the third wire by the same type of wire as the inter-chip bonding wire, the wire resistances can be made equal.

Therefore, the accuracy of operation of the first and second transfer gate elements can be prevented from being impaired due to the wire resistances becoming unbalanced among the first wire, the second wire, and the third wire, and performance of distance measurement using the sensor device can be improved.

Furthermore, the sensor device as an embodiment is a distance measurement sensor by an indirect ToF method.

In the indirect ToF method, a method of distributing accumulated charges of the photoelectric conversion element to two floating diffusions by the first and second transfer gate elements is employed.

Therefore, it is possible to improve the distance measurement performance by preventing the accuracy of operation of the first and second transfer gate elements from being impaired by applying the present technology.

Moreover, in the sensor device as the embodiment, the first wire, the second wire, and the third wire are formed by connecting the first portion and the second portion to each other by Cu—Cu connection.

The Cu—Cu connection is preferable as a connection technique between chips from the viewpoint of track record and reliability.

Therefore, it is possible to enhance the ease of implementation of the sensor device as the present embodiment.

Furthermore, in the sensor device according to the embodiment, the first wire and the second wire are arranged symmetrically with the photoelectric conversion element interposed therebetween.

Thus, for the first intermediate wire that is the wire connecting the first transfer gate element and the first wire and the second intermediate wire that is the wire connecting the second transfer gate element and the second wire, wire lengths can be made equal and wire resistances can be made equal.

Therefore, the drive signal is prevented from being unbalanced between the first and second transfer gate elements, the charge distribution to the two floating diffusions can be accurately performed, and the distance measurement performance can be improved.

Furthermore, in the sensor device according to the embodiment, wire widths of the first wire, the second wire, and the third wire are substantially the same.

This makes it possible to equalize respective wire resistances of the first wire, the second wire, and the third wire.

Therefore, the accuracy of operation of the first and second transfer gate elements can be prevented from being impaired due to the wire resistances becoming unbalanced among the first wire, the second wire, and the third wire, and performance of distance measurement using the sensor device can be improved.

Moreover, in the sensor device as the embodiment, cross-sectional areas of the first wire, the second wire, and the third wire are substantially the same.

This makes it possible to equalize respective wire resistances of the first wire, the second wire, and the third wire.

Therefore, the accuracy of operation of the first and second transfer gate elements can be prevented from being impaired due to the wire resistances becoming unbalanced among the first wire, the second wire, and the third wire, and performance of distance measurement using the sensor device can be improved.

Moreover, in the sensor device as the embodiment, in a direction orthogonal to a stacking direction of the first chip and the second chip, at least a part of the first wire overlaps the first transfer gate element and at least a part of the second wire overlaps the second transfer gate element.

Thus, for each of the first intermediate wire that is the wire connecting the first wire and the first transfer gate element and the second intermediate wire that is the wire connecting the second wire and the second transfer gate element, it is not necessary to route the wires in the direction orthogonal to the above-described stacking direction, and the wire resistances of the both wires can be reduced. Furthermore, the line-to-line capacitance with the adjacent wire can also be reduced.

Since the wire resistances and the line-to-line capacitance can be reduced, blunting of the drive waveforms of the first and second transfer gate elements can be suppressed, and a transfer drive signal of a higher frequency can be transmitted.

Furthermore, in the sensor device according to the embodiment, the first wire and the first transfer gate element, and the second wire and the second transfer gate element are connected by a connection portion (30) including one or a plurality of vias (v) and extending substantially linearly in the stacking direction.

Thus, the respective wire lengths of the first intermediate wire that is a wire connecting the first wire and the first transfer gate element and the second intermediate wire that is a wire connecting the second wire and the second transfer gate element can be set to a length corresponding to a separation distance in the stacking direction between the first wire and the first transfer gate element and a length corresponding to a separation distance in the stacking direction between the second wire and the second transfer gate element, and the wire resistances of the first and second intermediate wires and the line-to-line capacitance with the adjacent wire can be minimized.

Therefore, the blunting of the drive waveforms of the first and second transfer gate elements can be suppressed, and a transfer drive signal of a higher frequency can be transmitted.

Moreover, in the sensor device according to the embodiment, an interval between the first wire and the third wire adjacent to the first wire and an interval between the second wire and the third wire adjacent to the second wire are substantially equal.

Thus, the line-to-line capacitance (parasitic capacitance acting on the first wire) between the first wire and the third wire and the line-to-line capacitance (parasitic capacitance acting on the second wire) between the second wire and the third wire become substantially equal, the blunting of the drive waveforms of the first and second transfer gate elements does not become unbalanced, and it is possible to accurately perform charge distribution to the two floating diffusions.

Therefore, the distance measurement performance can be improved.

Furthermore, in the sensor device as an embodiment, in the first wire formation layer, a wire layer in which the first portions of the first wire, the second wire, and the third wire are formed, and an intermediate wire layer other than the wire layer are formed, and at least a part of the third wire overlaps the pixel in a direction orthogonal to a stacking direction of the first chip and the second chip, and the third wire is connected in the pixel to an intermediate ground wire that is a wire formed in the intermediate wire layer and connected to a ground in the pixel.

This makes it possible to increase the cross-sectional area of the third wire (ground wire).

Since the cross-sectional area of the ground wire can be increased, the wire width of the ground wire can be narrowed without increasing the impedance. By narrowing the wire width of the ground wire, the line-to-line capacitance between the first and second wires and the ground wire can be reduced, the waveform blunting of the drive pulse can be suppressed, and transfer signal transmission of a higher frequency can be achieved.

Furthermore, a distance measurement device (10) according to an embodiment includes a light emitting unit (2) that emits irradiation light (Li) to an object, and a sensor unit (1) that receives reflected light (Lr) of the irradiation light from the object, in which the sensor unit includes a first chip including a first semiconductor substrate and a first wire formation layer and including a pixel that includes a photoelectric conversion element, and a first transfer gate element and a second transfer gate element configured to transfer accumulated charges of the photoelectric conversion element, and a second chip including a second semiconductor substrate and a second wire formation layer, a first wire electrically connected to the first transfer gate element, a second wire electrically connected to the second transfer gate element, and a third wire electrically connected to a ground are formed, and each of the first wire, the second wire, and the third wire is formed by bonding a first portion formed in the first wire formation layer and extending in a first direction and a second portion formed in the second wire formation layer and extending in the first direction.

Even with such a distance measurement device as the embodiment, it is possible to obtain a similar operation and effect to those of the sensor device described above as the embodiment.

Note that effects described in the present description are merely examples and are not limited, and other effects may be provided.

9. Present Technology

Note that the present technology can employ configurations as follows.

(1)
A sensor device including:
a first chip including a first semiconductor substrate and a first wire formation layer and including a pixel that includes a photoelectric conversion element, and a first transfer gate element and a second transfer gate element configured to transfer accumulated charges of the photoelectric conversion element; and
a second chip including a second semiconductor substrate and a second wire formation layer, in which
a first wire electrically connected to the first transfer gate element,
a second wire electrically connected to the second transfer gate element, and
a third wire electrically connected to a ground are formed, and
each of the first wire, the second wire, and the third wire is formed by bonding a first portion formed in the first wire formation layer and extending in a first direction and a second portion formed in the second wire formation layer and extending in the first direction.

(2)
The sensor device according to (1) above, in which
the sensor device is a distance measurement sensor by an indirect time-of-flight (ToF) method.

(3)
The sensor device according to (1) or (2) above, in which
the first wire, the second wire, and the third wire are formed by connecting the first portion and the second portion to each other by copper-copper (Cu—Cu) connection.

(4)
The sensor device according to any one of (1) to (3) above, in which
the first wire and the second wire are arranged symmetrically with the photoelectric conversion element interposed therebetween.

(5)
The sensor device according to any one of (1) to (4) above, in which
wire widths of the first wire, the second wire, and the third wire are substantially same.

(6)
The sensor device according to any one of (1) to (5) above, in which
cross-sectional areas of the first wire, the second wire, and the third wire are substantially same.

(7)
The sensor device according to any one of (1) to (6) above, in which
in a direction orthogonal to a stacking direction of the first chip and the second chip, at least a part of the first wire overlaps the first transfer gate element and at least a part of the second wire overlaps the second transfer gate element.

(8)
The sensor device according to (7) above, in which
the first wire and the first transfer gate element, and the second wire and the second transfer gate element are connected by a connection portion including one or a plurality of vias and extending substantially linearly in the stacking direction.

(9)
The sensor device according to any one of (1) to (8) above, in which
an interval between the first wire and the third wire adjacent to the first wire and an interval between the second wire and the third wire adjacent to the second wire are substantially equal.

(10)
The sensor device according to any one of (1) to (9) above, in which
in the first wire formation layer,
a wire layer in which the first portions of the first wire, the second wire, and the third wire are formed, and an intermediate wire layer other than the wire layer are formed,
at least a part of the third wire overlaps the pixel in a direction orthogonal to a stacking direction of the first chip and the second chip, and
the third wire is connected in the pixel to an intermediate ground wire that is a wire formed in the intermediate wire layer and connected to a ground in the pixel.

(11)
A distance measurement device including:
a light emitting unit that emits irradiation light to an object; and
a sensor unit that receives reflected light of the irradiation light from the object, in which

23

24 the sensor unit includes a first chip including a first semiconductor substrate and a first wire formation layer and including a pixel that includes a photoelectric conversion element, and a first transfer gate element and a second transfer gate element configured to transfer accumulated charges of the photoelectric conversion element, and a second chip including a second semiconductor substrate and a second wire formation layer, a first wire electrically connected to the first transfer gate element, a second wire electrically connected to the second transfer gate element, and a third wire electrically connected to a ground are formed, and each of the first wire, the second wire, and the third wire is formed by bonding a first portion formed in the first wire formation layer and extending in a first direction and a second portion formed in the second wire formation layer and extending in the first direction.

REFERENCE SIGNS LIST

1 Sensor unit (sensor device)
2 Light emitting unit
10 Distance measurement device
Ob Object
Li Irradiation light
Lr Reflected light
11 Pixel array unit
20 Pixel drive line
21 Gate drive line
22 Vertical signal line
Px Pixel
PD Photodiode
FD Floating diffusion
TG Transfer transistor
RST Reset transistor
Cp1 First chip
Cp2 Second chip
Bs1 First semiconductor substrate
Bs2 Second semiconductor substrate
Ar1 First wire formation layer
Ar2 Second wire formation layer
W21-A, W21-B, Wg Inter-chip bonding wire
p1-A, p1-B, p1-g First portion
p2-A, p2-B, p2-g Second portion
Lym Intermediate wire layer
v Via
30 Connection portion
31 Intermediate ground wire
The invention claimed is:

1. A sensor device, comprising:
a first chip including a first semiconductor substrate and a first wire formation layer, wherein the first wire formation layer includes a first portion;
a pixel array on the first chip, wherein
the pixel array includes a plurality of pixels in a column direction of the pixel array,
each pixel of the plurality of pixels includes;
a photoelectric conversion element,
a first transfer gate element, and
a second transfer gate element, and
each of the first transfer gate element and the second transfer gate element is configured to transfer accumulated charges of the photoelectric conversion element; and a second chip including a second semiconductor substrate and a second wire formation layer, wherein
the second wire formation layer includes a second portion,
the first portion of the first wire formation layer is bonded to the second portion of the second wire formation layer,
the first portion and the second portion correspond to each of a first wire, a second wire, and a third wire,
the first wire is electrically connected to the first transfer gate element of each pixel of the plurality of pixels,
the second wire is electrically connected to the second transfer gate element of each pixel of the plurality of pixels,
the third wire is electrically connected to a ground associated with the first semiconductor substrate,
each of the first wire, the second wire, and the third wire extends in the column direction of the pixel array, and
in the column direction of the pixel array, the third wire passes through each pixel of the plurality of pixels.

2. The sensor device according to claim 1, wherein the sensor device is a distance measurement sensor by an indirect time-of-flight (ToF) method.

3. The sensor device according to claim 1, wherein the first portion is connected to the second portion by a copper-copper (Cu—Cu) connection.

4. The sensor device according to claim 1, wherein the first wire and the second wire are in a symmetrical arrangement, with the photoelectric conversion element between the first wire and the second wire.

5. The sensor device according to claim 1, wherein a wire width of the first wire, a wire width of the second wire, and a wire width of the third wire are substantially same.

6. The sensor device according to claim 1, wherein a cross-sectional area of the first wire, a cross-sectional area of the second wire, and a cross-sectional area of the third wire are substantially same.

7. The sensor device according to claim 1, wherein, in a direction orthogonal to a stacking direction of the first chip and the second chip, at least a part of the first wire overlaps the first transfer gate element of each pixel of the plurality of pixels, and at least a part of the second wire overlaps the second transfer gate element of each pixel of the plurality of pixels.

8. The sensor device according to claim 7, further comprising a connection portion, wherein
the first wire is connected to the first transfer gate element of each pixel of the plurality of pixels via the connection portion,
the second wire is connected to the second transfer gate element of each pixel of the plurality of pixels via the connection portion,
the connection portion includes one of a via or a plurality of vias, and
the one of the via or the plurality of vias linearly extends in the stacking direction.

9. The sensor device according to claim 1, further comprising a fourth wire electrically connected to the ground, wherein
the third wire is adjacent to the first wire,
the fourth wire is adjacent to the second wire,
an interval between the first wire and the third wire and an interval between the second wire and the fourth are substantially equal.

10. The sensor device according to claim 1, wherein
the first wire formation layer includes a wire layer and an
intermediate wire layer different from the wire layer,
the wire layer includes a plurality of first portions,
the plurality of first portions includes the first portion
corresponding to each of the first wire, the second wire,
and the third wire,
at least a part of the third wire overlaps each pixel of the
plurality of pixels in a direction orthogonal to a stack-
ing direction of the first chip and the second chip,
the intermediate wire layer includes an intermediate
ground wire, and
in each pixel of the plurality of pixels, the third wire is
connected to the ground via the intermediate ground
wire.

11. A distance measurement device, comprising:
a light emitting unit configured to emit irradiation light to
an object; and
a sensor unit configured to receive reflected light of the
irradiation light from the object, wherein the sensor
unit includes:
  a first chip including a first semiconductor substrate and
    a first wire formation layer, wherein the first wire
    formation layer includes a first portion;
  a pixel array on the first chip, wherein
    the pixel array includes a plurality of pixels in a
     column direction of the pixel array,
    each pixel of the plurality of pixels includes:
      a photoelectric conversion element,
      a first transfer gate element, and
      a second transfer gate element, and each of the first transfer gate element and the second
       transfer gate element is configured to transfer
       accumulated charges of the photoelectric conver-
       sion element; and
a second chip including a second semiconductor sub-
strate and a second wire formation layer, wherein
  the second wire formation layer includes a second
    portion,
  the first portion of the first wire formation layer is
    bonded to the second portion of the second wire
    formation layer,
  the first portion and the second portion correspond to
    each of a first wire, a second wire, and a third wire,
  the first wire is electrically connected to the first
    transfer gate element of each pixel of the plurality
    of pixels,
  the second wire is electrically connected to the
    second transfer gate element of each pixel of the
    plurality of pixels,
  the third wire is electrically connected to a ground
    associated with the first semiconductor substrate,
  each of the first wire, the second wire, and the third
    wire extends in the column direction of the pixel
    array, and
  in the column direction of the pixel array, the third
    wire passes through each pixel of the plurality of
    pixels.

* * * * *